(12) United States Patent
Zidan et al.

(10) Patent No.: US 11,488,650 B2
(45) Date of Patent: Nov. 1, 2022

(54) MEMORY PROCESSING UNIT ARCHITECTURE

(71) Applicants: Mohammed A. Zidan, Ann Arbor, MI (US); Jacob Christopher Botimer, Ann Arbor, MI (US); Chester Liu, Ann Arbor, MI (US); Fan-hsuan Meng, Ann Arbor, MI (US); Timothy Alan Wesley, Ann Arbor, MI (US); Zhengya Zhang, Ann Arbor, MI (US); Wei Lu, Ann Arbor, MI (US)

(72) Inventors: Mohammed A. Zidan, Ann Arbor, MI (US); Jacob Christopher Botimer, Ann Arbor, MI (US); Chester Liu, Ann Arbor, MI (US); Fan-hsuan Meng, Ann Arbor, MI (US); Timothy Alan Wesley, Ann Arbor, MI (US); Zhengya Zhang, Ann Arbor, MI (US); Wei Lu, Ann Arbor, MI (US)

(73) Assignee: MemryX Incorporated, Ann Arbor, MI (US)

( * ) Notice: Subject to any disclaimer, the term of this patent is extended or adjusted under 35 U.S.C. 154(b) by 0 days.

(21) Appl. No.: 16/841,544

(22) Filed: Apr. 6, 2020

(65) Prior Publication Data
US 2021/0312977 A1 Oct. 7, 2021

(51) Int. Cl.
*G11C 11/406* (2006.01)
*G06N 5/04* (2006.01)
*G06N 3/08* (2006.01)
*G11C 11/407* (2006.01)

(52) U.S. Cl.
CPC ........ *G11C 11/40618* (2013.01); *G06N 3/084* (2013.01); *G06N 5/046* (2013.01); *G11C 11/407* (2013.01)

(58) Field of Classification Search
CPC . G11C 11/40618; G11C 11/407; G06N 3/084; G06N 5/046
USPC .................................................. 711/150, 157
See application file for complete search history.

(56) References Cited

U.S. PATENT DOCUMENTS

| | | | | |
|---|---|---|---|---|
| 6,901,491 | B2 * | 5/2005 | Kohn | H04L 45/745 711/157 |
| 8,181,168 | B1 * | 5/2012 | Lee | G06F 8/41 717/149 |
| 10,116,557 | B2 * | 10/2018 | Gray | H04L 45/60 |
| 2003/0041082 | A1 | 2/2003 | Dibrino | |
| 2004/0076044 | A1 | 4/2004 | Nowshadi | |

(Continued)

FOREIGN PATENT DOCUMENTS

| | | |
|---|---|---|
| KR | 1020120028229 | 3/2012 |
| KR | 1020130128695 | 11/2013 |
| KR | 1020160140394 | 12/2016 |

*Primary Examiner* — Michael T Tran

(57) ABSTRACT

A memory processing unit architecture can include a plurality of memory regions and a plurality of processing regions interleaved between the plurality of memory regions. The plurality of processing regions can be configured to perform computation functions of a model such as an artificial neural network. Data can be transferred between the computation functions in respective memory processing regions. In addition, the memory regions can be utilized to transfer data between a computation function in one processing region and a computation function in another processing region adjacent to the given memory region.

24 Claims, 32 Drawing Sheets

(56) References Cited

U.S. PATENT DOCUMENTS

| | | | |
|---|---|---|---|
| 2004/0213036 A1 | 10/2004 | Farrell et al. | |
| 2004/0230633 A1 | 11/2004 | Busada et al. | |
| 2005/0177344 A1* | 8/2005 | Khaleel | G06F 11/3404 702/186 |
| 2006/0023554 A1* | 2/2006 | Matsushita | G11C 16/32 365/230.03 |
| 2006/0133186 A1* | 6/2006 | Hummler | G11C 7/1018 365/230.06 |
| 2006/0212505 A1 | 9/2006 | Islam | |
| 2008/0056051 A1* | 3/2008 | Mayer | G11C 5/147 365/230.03 |
| 2008/0229143 A1* | 9/2008 | Muraki | G06F 11/2028 714/3 |
| 2009/0077550 A1* | 3/2009 | Rhine | G06F 9/45558 718/1 |
| 2009/0150646 A1* | 6/2009 | Allen | G06F 12/0246 711/213 |
| 2010/0228923 A1 | 9/2010 | Lim | |
| 2010/0308858 A1 | 12/2010 | Noda et al. | |
| 2010/0332775 A1 | 12/2010 | Kapil et al. | |
| 2013/0090907 A1 | 4/2013 | Maliassov | |
| 2013/0125097 A1* | 5/2013 | Ebcioglu | G06F 8/40 717/136 |
| 2014/0344527 A1* | 11/2014 | Kaku | G06F 9/461 711/147 |
| 2014/0363124 A1* | 12/2014 | Pelley | G02B 6/3596 385/16 |
| 2015/0085575 A1 | 3/2015 | Tam | |
| 2016/0344629 A1* | 11/2016 | Gray | H04L 49/106 |
| 2017/0357891 A1 | 12/2017 | Judd et al. | |
| 2018/0234653 A1 | 8/2018 | Meixner et al. | |
| 2019/0042930 A1* | 2/2019 | Pugsley | G06N 3/088 |
| 2019/0336107 A1* | 11/2019 | Hope Simpson | G01S 15/8979 |
| 2020/0134825 A1* | 4/2020 | Li | G06N 3/08 |
| 2020/0364155 A1* | 11/2020 | Pawlowski | H03M 13/2782 |
| 2020/0379914 A1* | 12/2020 | Yudanov | H04L 67/535 |
| 2021/0067173 A1* | 3/2021 | Miele | G06F 9/5005 |
| 2021/0073066 A1* | 3/2021 | Bielby | G06N 3/049 |
| 2021/0142177 A1* | 5/2021 | Mallya | G06N 3/0454 |
| 2021/0192279 A1* | 6/2021 | Laaksonen | G06F 9/5077 |
| 2021/0203323 A1* | 7/2021 | Hsu | H03K 3/0372 |
| 2021/0229231 A1* | 7/2021 | Fukatsu | G05B 19/41875 |

* cited by examiner

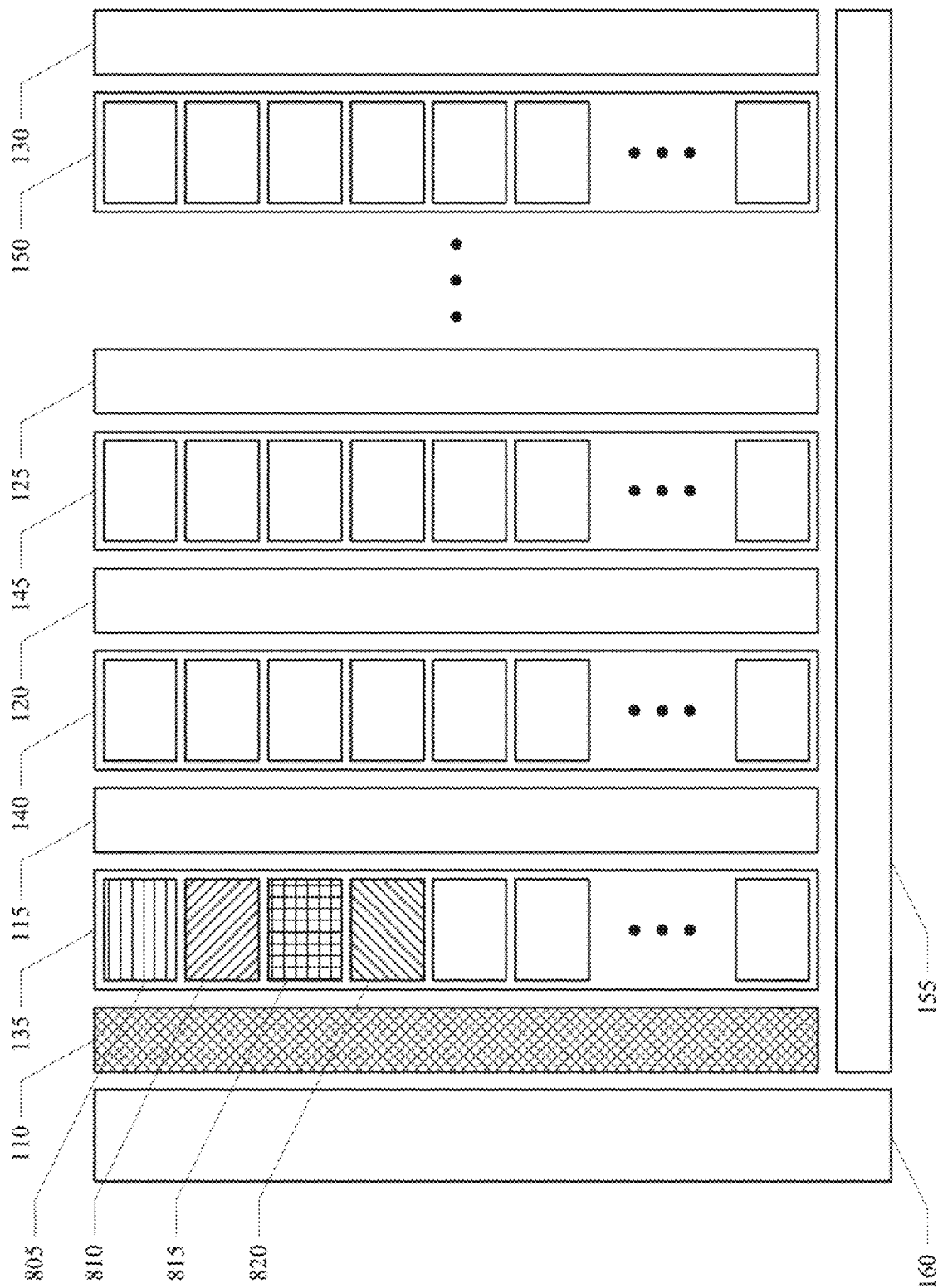

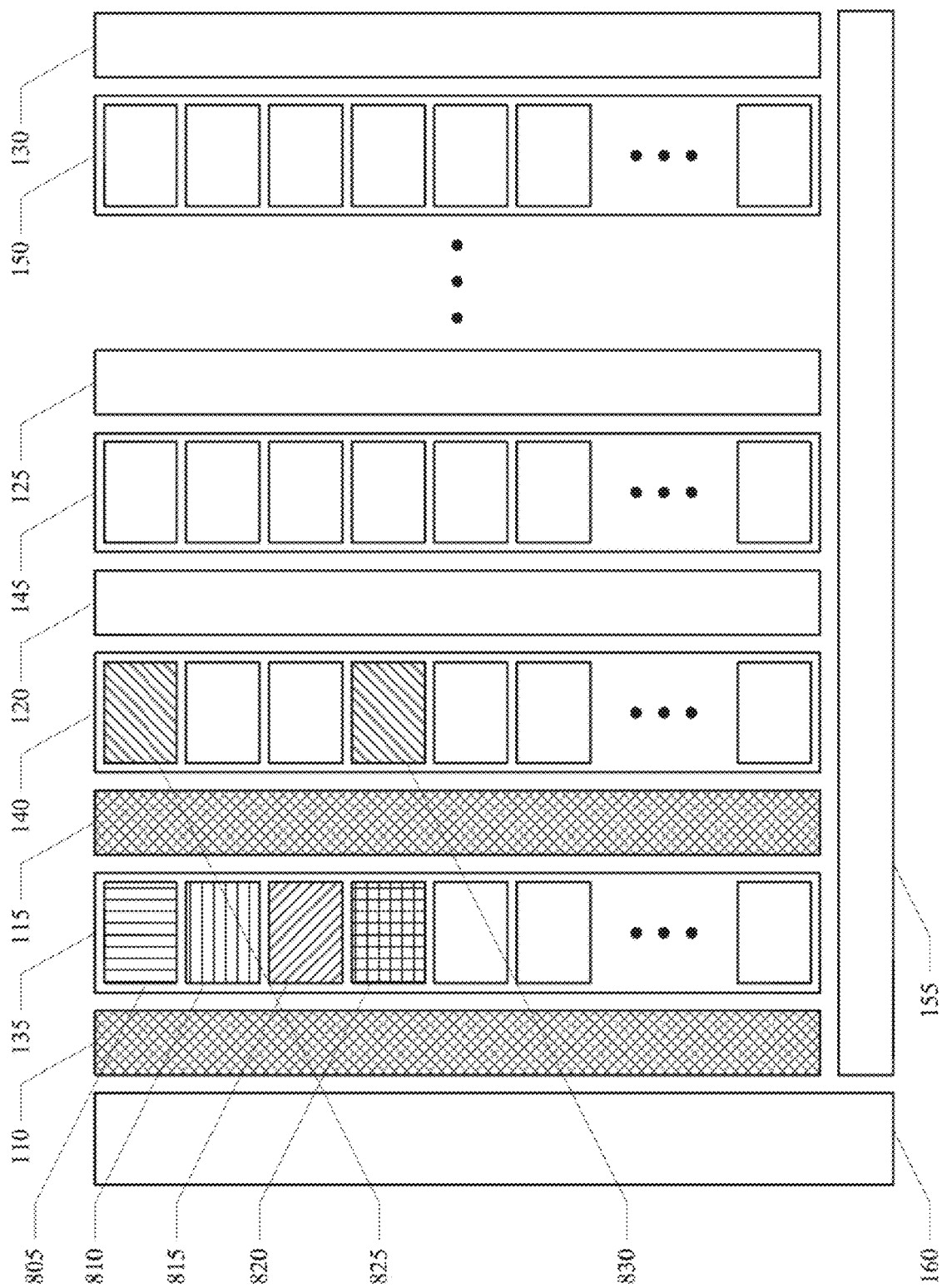

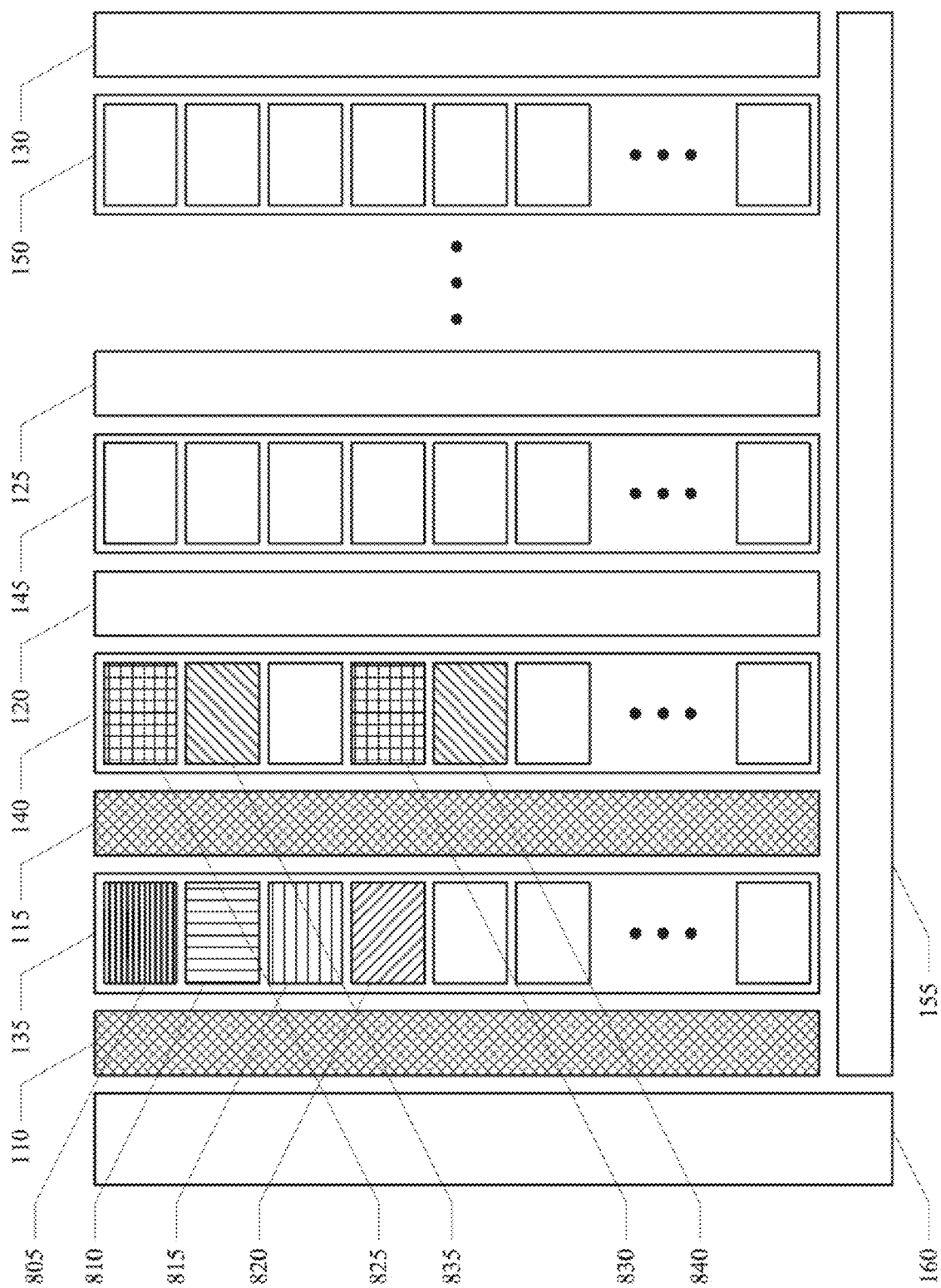

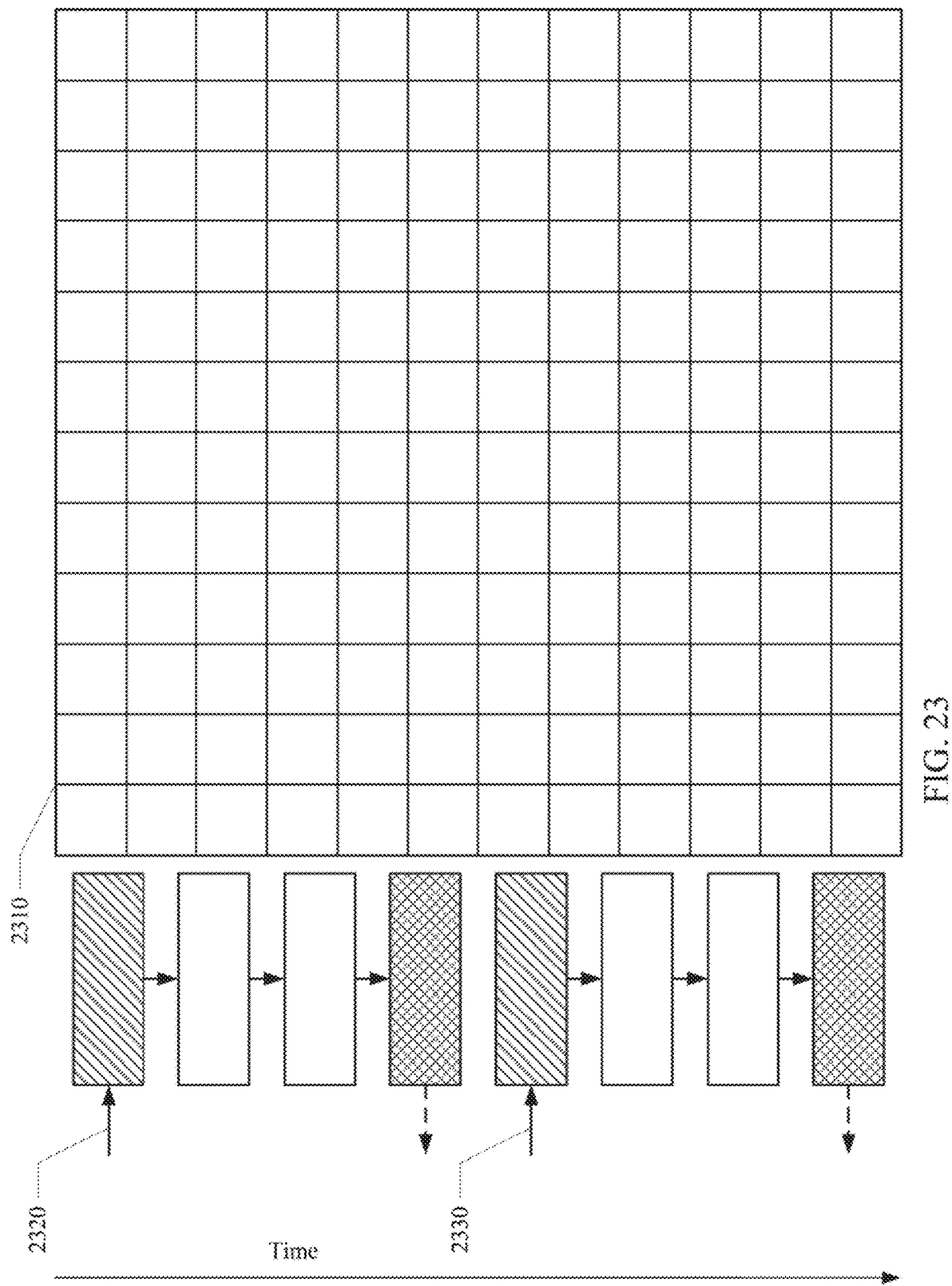

MEMORY PROCESSING UNIT ARCHITECTURE

CROSS-REFERENCE TO RELATED APPLICATIONS

This application claims the benefit of U.S. Provisional Patent Application No. 62/844,644 filed May 7, 2019, which is incorporated herein in its entirety.

BACKGROUND OF THE INVENTION

Computing systems have made significant contributions toward the advancement of modern society and are utilized in a number of applications to achieve advantageous results. Applications such as artificial intelligence, machine learning, big data analytics and the like perform computations on large amounts of data. In conventional computing systems, data is transferred from memory to one or more processing units, the processing units perform calculations on the data, and the results are then transferred back to memory. The transfer of large amounts of data from memory to the processing unit and back to memory takes time and consumes power. Accordingly, there is a continuing need for improved computing systems that reduce processing latency, data latency and or power consumption.

SUMMARY OF THE INVENTION

The present technology may best be understood by referring to the following description and accompanying drawings that are used to illustrate embodiments of the present technology directed toward a memory processing unit architecture. The architecture can include a plurality of memory regions, such as static random access memory (SRAM), and a plurality of processing regions, including memory such as resistive random access memory (ReRAM), magnetic random access memory (MRAM), Flash memory (FLASH), or phase change random access memory (PCRAM). The plurality of processing regions can be columnal interleaved between the plurality of memory regions. The plurality of processing regions can be configured to perform computation functions of a model such as an artificial neural network. Data can be configured to flow in a cross-columnal direction across the plurality of memory regions and processing regions.

In one embodiment, a memory processing unit can include a plurality of memory regions, a plurality of processing regions, and one or more centralized or distributed control circuitry. The plurality of processing regions can be interleaved between the plurality of memory regions. One or more of the plurality of processing regions can be configured to perform one or more computation functions. The one or more control circuitry can be configured to control data flow into each given one of the plurality of processing regions from a first adjacent one of the plurality of memory regions to a second adjacent one of the plurality of memory regions. The memory processing unit can further include one or more communication links that can be coupled between the interleaved plurality of memory regions and processing regions. The one or more communication links can be configured for moving data between non-adjacent ones of the plurality of memory regions and or the processing regions.

In another embodiment, a method of configuring a memory processing unit can include receiving a model. One or more of a plurality of processing regions of the memory processing unit can be configured to perform one or more computation functions of the model. One or more of a plurality of memory regions of the memory processing unit can be configured to control data flow into the one or more of the plurality of processing regions from a first adjacent memory region and out to a second adjacent memory region, wherein the plurality of processing regions are interleaved between the plurality of memory regions.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIGS. 8A through 8J illustrates configuration and operation of a memory processing unit, in accordance with aspects of the present technology.

FIG. 23 illustrates data reuse in a memory processing unit, in accordance with aspects of the present technology.

DETAILED DESCRIPTION OF THE INVENTION

Figure 1:
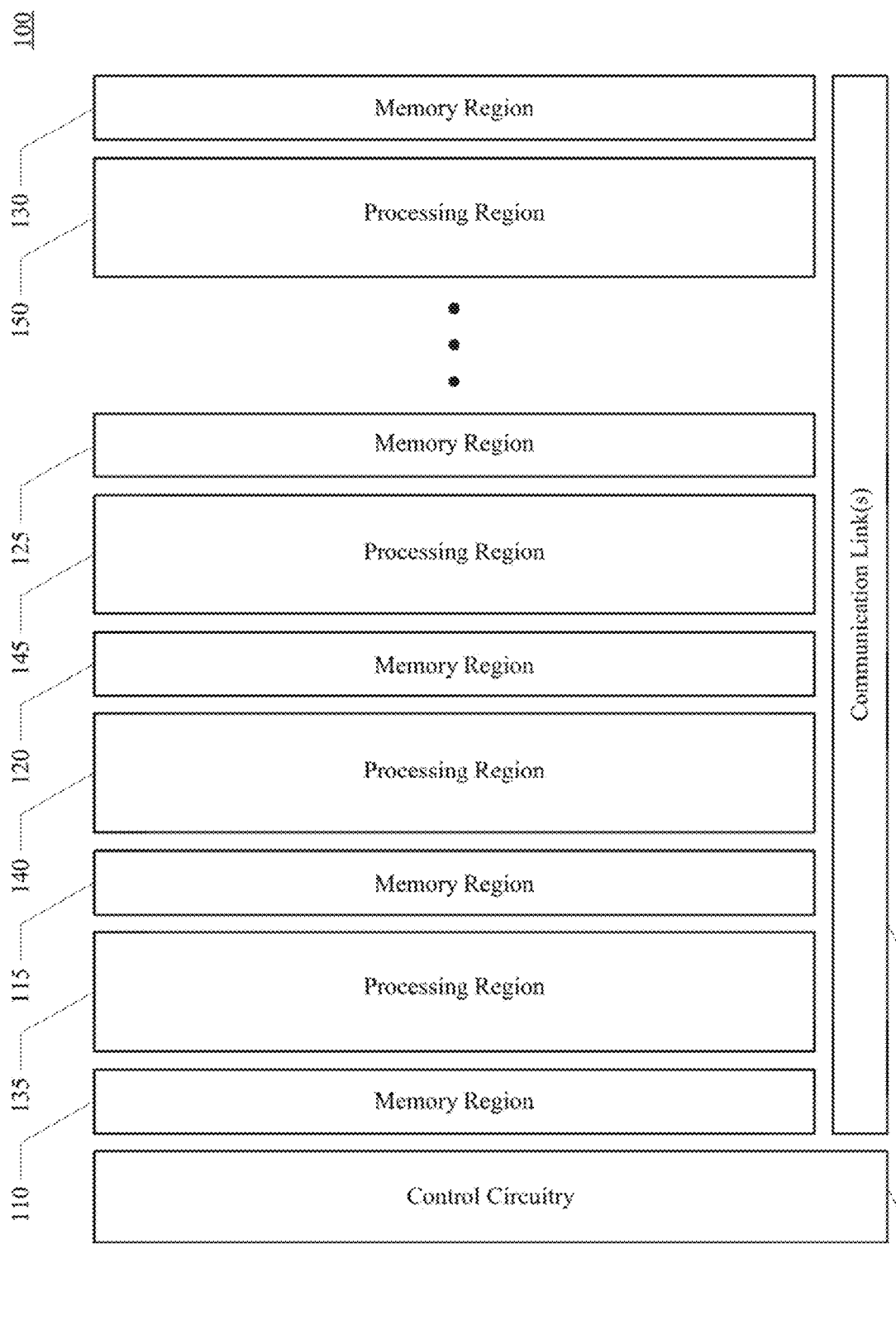
FIG. 1 shows a memory processing unit, in accordance with embodiments of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Referring now to FIG. 1, a memory processing unit, in accordance with embodiments of the present technology, is shown. The memory processing unit 100 can include a plurality of memory regions 110-130, a plurality of processing regions 135-150, one or more communication links 155, and one or more centralized or distributed control circuitry 160. The plurality of memory regions 110-130 can also be referred to as activation memory. The plurality of processing regions 135-150 can be interleaved between the plurality of memory regions 110-130. In one implementation, the plurality of memory regions 110-130 and the plurality of processing regions 135-150 can have respective predetermine sizes. The plurality of processing regions 135-150 can have the same design. Similarly, the plurality of memory region 110-130 can also have the same design. In one implementation, the plurality of memory regions 110-130 can be static random access memory (SRAM), and the plurality of processing regions can include one or more arrays of resistive random access memory (ReRAM), magnetic random access memory (MRAM), phase change random access memory (PCRAM), Flash memory (FLASH), or the like.

One or more of the plurality of processing regions 135-150 can be configured to perform one or more computation functions, one or more instances of one or more computation functions, one or more segments of one or more computation functions, or the like. For example, a first processing region 135 can be configured to perform two computation functions, and a second processing region 140 can be configured to perform a third computation function. In another example, the first processing region 135 can be configured to perform three instances of a first computation function, and the second processing region 140 can be configured to perform a second and third computation function. The one or more centralized or distributed control circuitry 160 can configure the one or more computation functions of the one or more of the plurality of processing regions 135-150. In yet another example, a given computation function can have a size larger than the predetermined size of the one or more processing regions. In such case, the given computation function can be segmented, and the computation function can be configured to be performed on one or more of the plurality of processing units 135-150. The computation functions can include, but are not limited to, vector products, matrix-dot-products, convolutions, min/max pooling, averaging, scaling, and or the like.

A central data flow direction can be utilized with the plurality of memory regions 110-130 and plurality of processing regions 135-150. The one or more centralized or distributed control circuitry 160 can control data flow into each given one of the plurality of processing regions 135-150 from a first adjacent one of the plurality of memory regions 110-130 to a second adjacent one of the plurality of memory regions 110-130. For example, the one or more control circuitry 160 can configure data to flow into a first processing region 135 from a first memory region 110 and out to a second memory region 115. Similarly, the one or more control circuitry 160 can configure data to flow into a second processing region 140 from the second memory region 115 and out to a third memory region 120. The control circuitry 160 can include a centralized control circuitry, distributed control circuitry or a combination thereof. If distributed, the control circuitry 160 can be local to the plurality of memory regions 110-130, the plurality of processing regions 135-150, and or one or more communication links 155.

In one implementation, the plurality of memory regions 110-130 and the plurality of processing regions 135-150 can be columnal interleaved with each other. The data can be configured by the one or more centralized or distributed control circuitry 160 to flow between adjacent columnal interleaved processing regions 135-150 and memory regions 110-130 in a cross-columnal direction. In one implementation, the data can flow in a unidirectional cross-columnal direction between adjacent processing regions 135-150 and memory regions 110-130. For example, data can be configured to flow from a first memory region 110 into a first processing region 135, from the first processing region 135 out to a second memory region 115, from the second memory region 115 into a second processing region 140, and so on. In another implementation, the data can flow in a bidirectional cross-columnal direction between adjacent processing regions 135-150 and memory regions 110-130. In addition or alternatively, data within respective ones of the processing region 135-150 can flow between functions within the same processing region. For example, for a first processing region 135 configured to perform two computation functions, data can flow from the first computation function directly to the second computation function without being written or read from an adjacent memory region.

The one or more communication links 155 can be coupled between the interleaved plurality of memory region 110-130 and plurality of processing regions 135-150. The one or more communication links 155 can be configured for moving data between non-adjacent ones of the plurality of memory regions 110-130, between non-adjacent ones of the plurality of processing regions 135-150, or between non-adjacent ones of a given memory region and a given processing region. For example, the one or more communication links 155 can be configured for moving data between the second memory region 115 and a fourth memory region 125. In addition or alternatively, the one or more communication links 155 can be configured for moving data between the first processing region 135 and a third processing region 145. In addition or alternatively, the one or more communication links 155 can be configured for moving data between the second memory region 115 and the third processing region 145, or between the second processing unit 140 and a fourth memory region 125.

Generally, the plurality of memory regions 110-130 and the plurality of processing regions 135-150 are configured such that partial sums move in a given direction through a given processing region. In addition, the plurality of memory regions 110-130 and the plurality of processing regions 135-150 are generally configured such that edge outputs move in a given direction from a given processing region to an adjacent memory region. The terms partial sums and edge outputs are used herein to refer to the results of a given computation function or a segment of a computation function.

Figure 2:
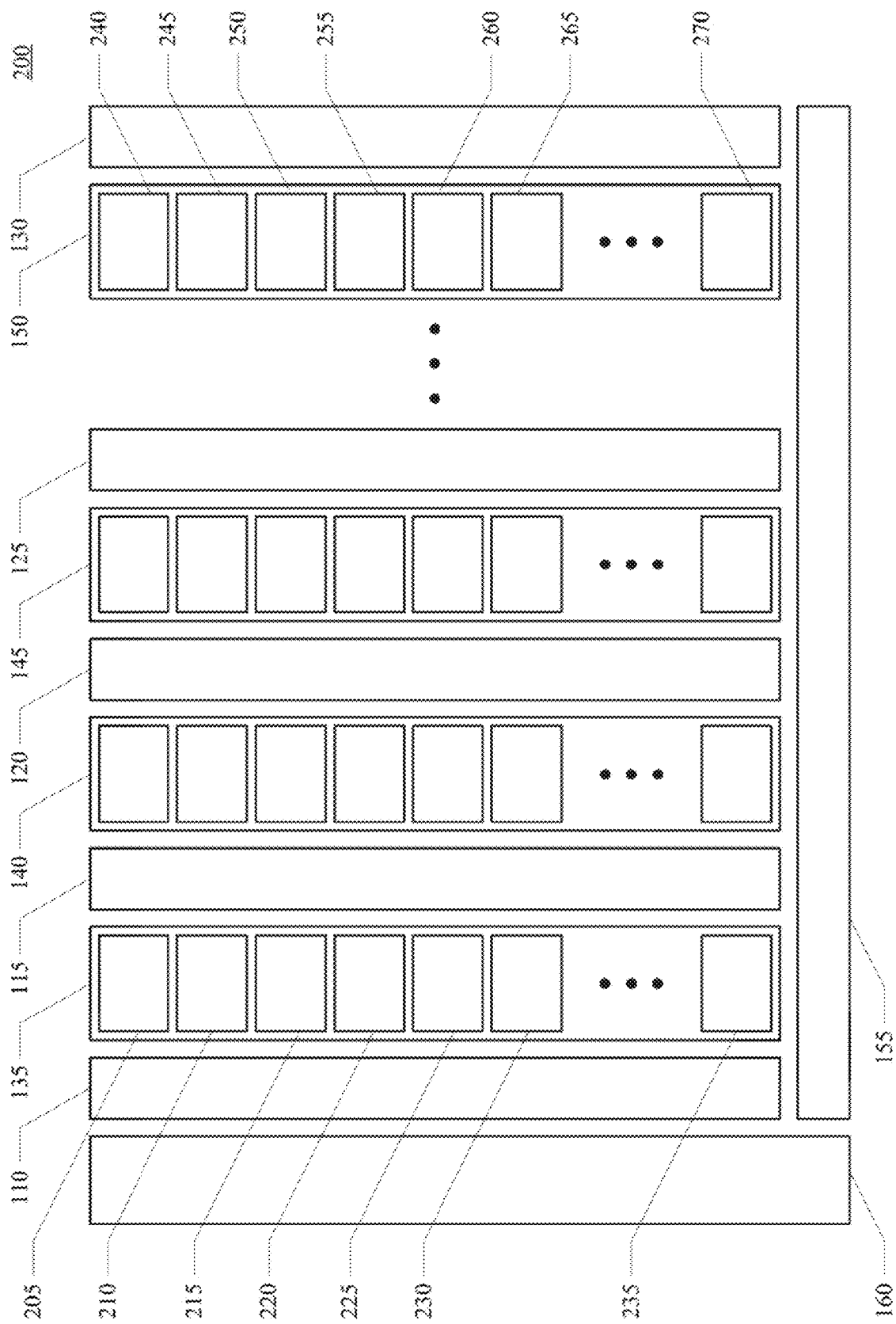
FIG. 2 shows a memory processing unit, in accordance with embodiments of the present technology.

Referring now to FIG. 2, a memory processing unit, in accordance with embodiments of the present technology, is shown. The memory processing unit 200 can include a plurality of memory regions 110-130, a plurality of processing regions 135-150, one or more communication links 155, and one or more centralized or distributed control circuitry 160. The plurality of processing regions 135-150 can be interleaved between the plurality of memory regions 110-130. In one implementation, the plurality of memory regions 110-130 and the plurality of processing regions 135-150 can be columnal interleaved with each other. In one implementation, the plurality of memory region 110-130 and the plurality of processing regions 135-150 can have respective predetermined sizes.

Each of the plurality of processing regions 135-150 can include a plurality of processing cores 205-270. In one implementation, the plurality of processing cores 205-270 can have a predetermined size. One or more of the processing cores 205-270 of one or more of the processing regions 135-150 can be configured to perform one or more computation functions, one or more instance of one or more computation functions, one or more segments of one or more computation function, or the like. For example, a first processing core 205 of a first processing region 135 can be configured to perform a first computation function, a second processing core 210 of the first processing region 135 can be configured to perform a second computation function, and a first processing core of a second processing region 140 can be configured to perform a third computation function. Again, the computation functions can include but are not limited to vector products, matrix-dot products, convolutions, min/max pooling, averaging, scaling, and or the like.

The one or more centralized or distributed control circuitry 160 can also configure the plurality of memory regions 110-130 and the plurality of processing regions 135-150 so that data flows into each given one of the plurality of processing regions 135-150 from a first adjacent one of the plurality of memory region 110-130 to a second adjacent one of the plurality of memory regions 110-130. For example, the one or more control circuitry 160 can configure data to flow into a first processing region 135 from a first memory region 110 and out to a second memory region 115. Similarly, the one or more control circuitry 160 can configure data to flow into a second processing region 140 from the second memory region 115 and out to a third memory region 120. In one implementation, the control circuitry 160 can configure the plurality of memory regions 110-130 and the plurality of processing regions 135-150 so that data flows in a single direction. For example, the data can be configured to flow unidirectionally from left to right across one or more processing regions 135-150 and the respective adjacent one of the plurality of memory regions 110-130. In another implementation, the control circuitry 160 can configure the plurality of memory regions 110-130 and the plurality of processing regions 135-150 so that data flows bidirectionally across one or more processing regions 135-150 and the respective adjacent one of the plurality of memory regions 110-130. In addition, the one or more control circuitry 160 can also configure the data to flow in a given direction through one or more processing cores 205-270 in each of the plurality of processing regions 135-150. For example, the data can be configured to flow from top to bottom from a first processing core 205 through a second processing core 210 to a third processing core 215 in a first processing region 135.

Figure 3:
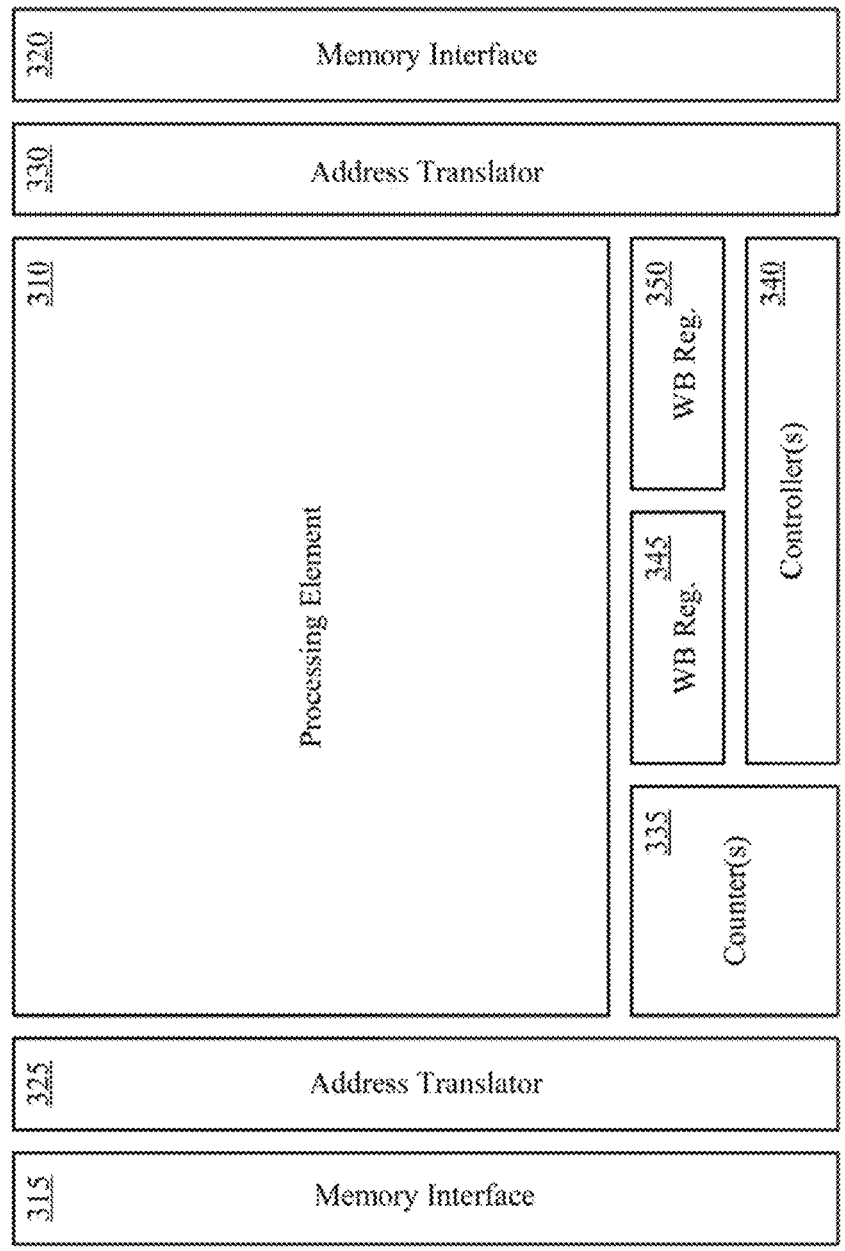
FIG. 3 shows a processing core, in accordance with aspects of the present technology.

Referring now to FIG. 3, a processing core, in accordance with aspects of the present technology, is shown. The processing core 300 can include a processing element 310, one or more memory region interfaces 315, 320, one or more address translators 325, 330, one or more counters 335, one or more controllers 340 and one or more writeback registers 345, 350. The processing element 310 can be configured to compute computation functions such as vector products, matrix-dot-products, convolutions or the like. The memory interfaces 315, 320 can be configured to interface with a respective adjacent memory region. The address translators 325, 330 can be configured to translate multi-dimension data, such as feature maps, to the one-dimensional memory organization within the processing element 310. The counters 335, such as pixel counters, bit counters, channel counters and the like, can be configured to scan over the data. The writeback registers 345, 350 can be configured to hide memory access latency in the processing core 300, and can also perform min/max pooling, averaging, scaling and the like. The controllers 340 can configure the one or more memory region interfaces 315, 320, one or more address translators 325, 330, one or more counter 335 and one or more writeback register 345, 350. Also, each core can communicate (pass data) with the adjacent cores (the top and the bottom cores).

Figure 4:
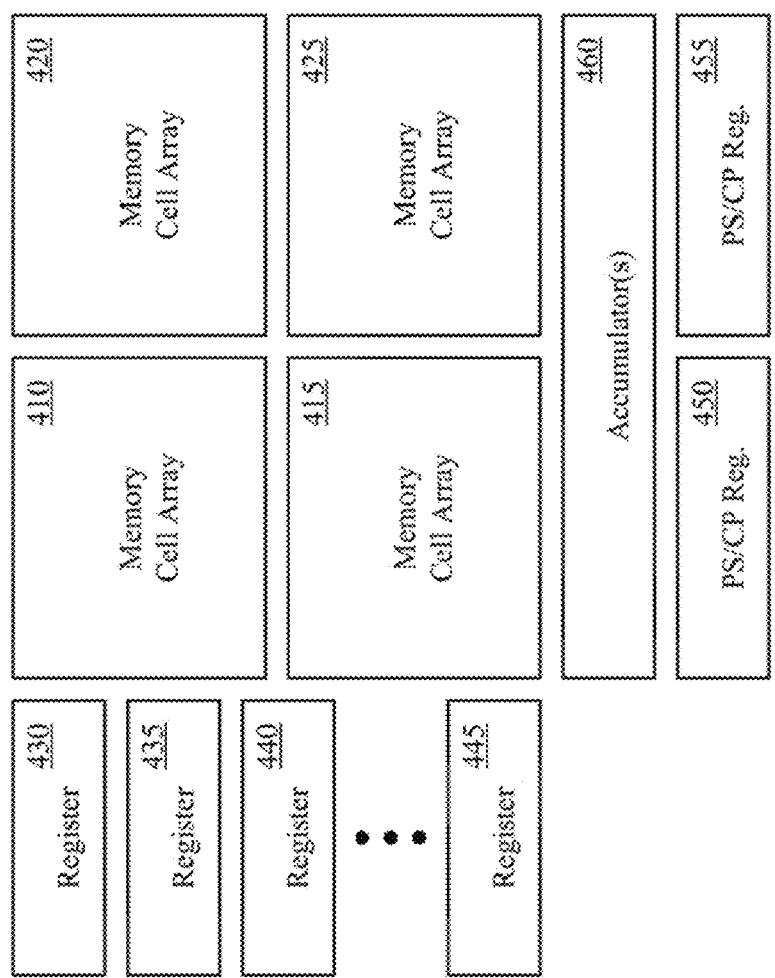
FIG. 4 shows a processing element, in accordance with aspects of the present technology.

Referring now to FIG. 4, a processing element 400, in accordance with aspects of the present technology, is shown. The processing element 400 can include one or more memory cell arrays 410-425, one or more input registers 430-445, one or more output registers 450, 455, and one or more accumulators 460. The processing element 400 can share one or more memory cell array 410-425 with one or more adjacent processing elements. The array of memory cells 410-425 can include arrays of resistive random-access memory (ReRAM), magnetic random access memory (MRAM), phase change random access memory (PCRAM), Flash memory (FLASH), or the like. The memory cell arrays 410-425 can include a plurality of memory cells arranged in a plurality of rows of memory cells coupled to respective word lines and a plurality of columns of the memory cells coupled to respective bit lines. In one implementation, the memory cells can be configured to store elements of a first matrix. Sets of input registers can be associated with a respective set of word lines. In one implementation, the input registers can be configured to store respective elements of a second matrix. The respective word lines can be biased based on bit values of sequential bit positions in the corresponding input registers. The respective bit lines can be sensed to determine bit values in response to the biased word lines. Each accumulator 460 can be associated with a respective set of bit lines. The accumulators 460 can include respective adder and shift registers configured to sum a sensed bit value to a content of a corresponding shift register which is then loaded back into the shift register. Each shift register can be configured to shift the sum in a given direction after each sum is loaded into the shift register. The shift register of the accumulators 460 can then output a result to the output registers 450, 455. In one implementation, the output can be a partial sum of the content of the input register and the content of the memory cell array. For example, the partial sum can be a dot product of the first and second matrix.

Figure 5:
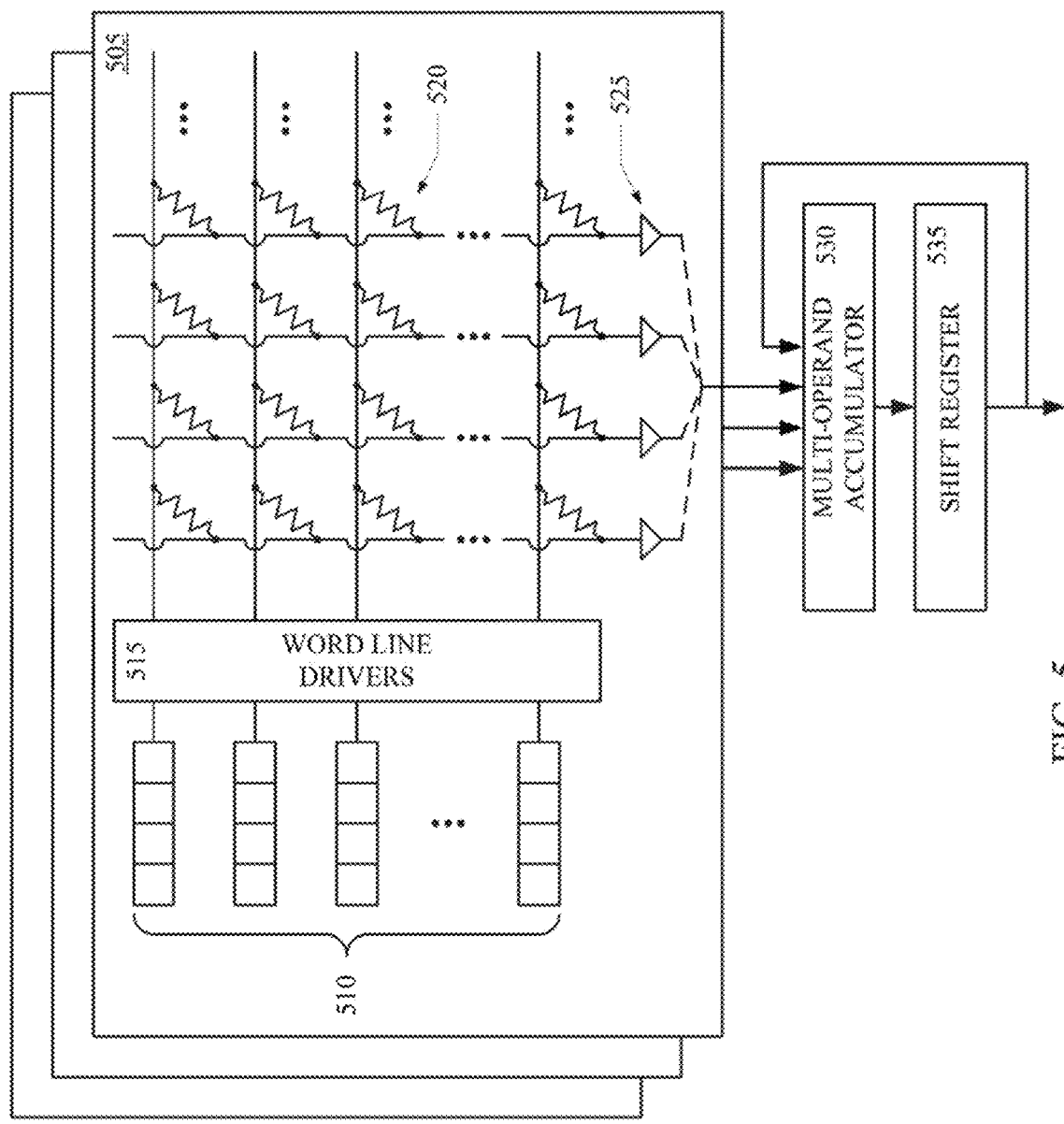
FIG. 5 shows a processing element, in accordance with aspects of the present technology.

Referring now to FIG. 5, a processing element, in accordance with aspects of the present technology, is shown. Generally, the processing element can be a multiply accumulate (MAC) unit. In one implementation, the processing element 500 can include one or more sets of array units 505. Each array unit 505 can include one or more sets of input registers 510, word line drivers 515, an array of memory cells 520, and readout circuitry 525. Each set of array units 505 can be coupled to a respective multi-operand accumulators 530, and respective shift register 535. The multi-operand accumulators 530 can be carry-save adders, Wallace trees, or the like.

Respective word lines in a corresponding set of cell units 505 can be activated simultaneously. Each accumulator 530 can be configured to sum partial sums from the corresponding readout circuitry 525 of a set of array units 505 and the content of a corresponding shift register 535. The sum can then be loaded back into the corresponding shift register 535. Each shift register 535 can be configured to shift the sum in a given direction. For example, if the word line driver 515 biases the word lines based on the input registers 510 sequenced from most-significant-bit to least-significant bit, the shift register 535 can shift its content one bit to the left after each time the sum from the accumulator 530 is loaded into the shift register 535. If the input registers 510 are sequenced from least-significant-bit to most-significant-bit, the shift register 535 can perform a right shift on the sum. After sequencing over the word lines and over the bit positions of the input buffer of a set of array units 505, the resulting dot product can be output form the shift register 535.

The array units 505 can be arranged to increase the length or width of the matrix, or both dimensions. In one implementation, the array units 505 can be arranged horizontally to increase the width for storing larger matrices A, while having minimal impact on the hardware design of the processing element 500. In another implementation, the array units 505 can be arranged vertically to increase the length of matrix A. In the vertical implementation, the multi-operand accumulator 530 shared among the vertical compute slices can reduce the size of the accumulator 530 and shift register 535. The above described processing element 500 is just one of many possible implementations of the processing element 500.

Figure 6:
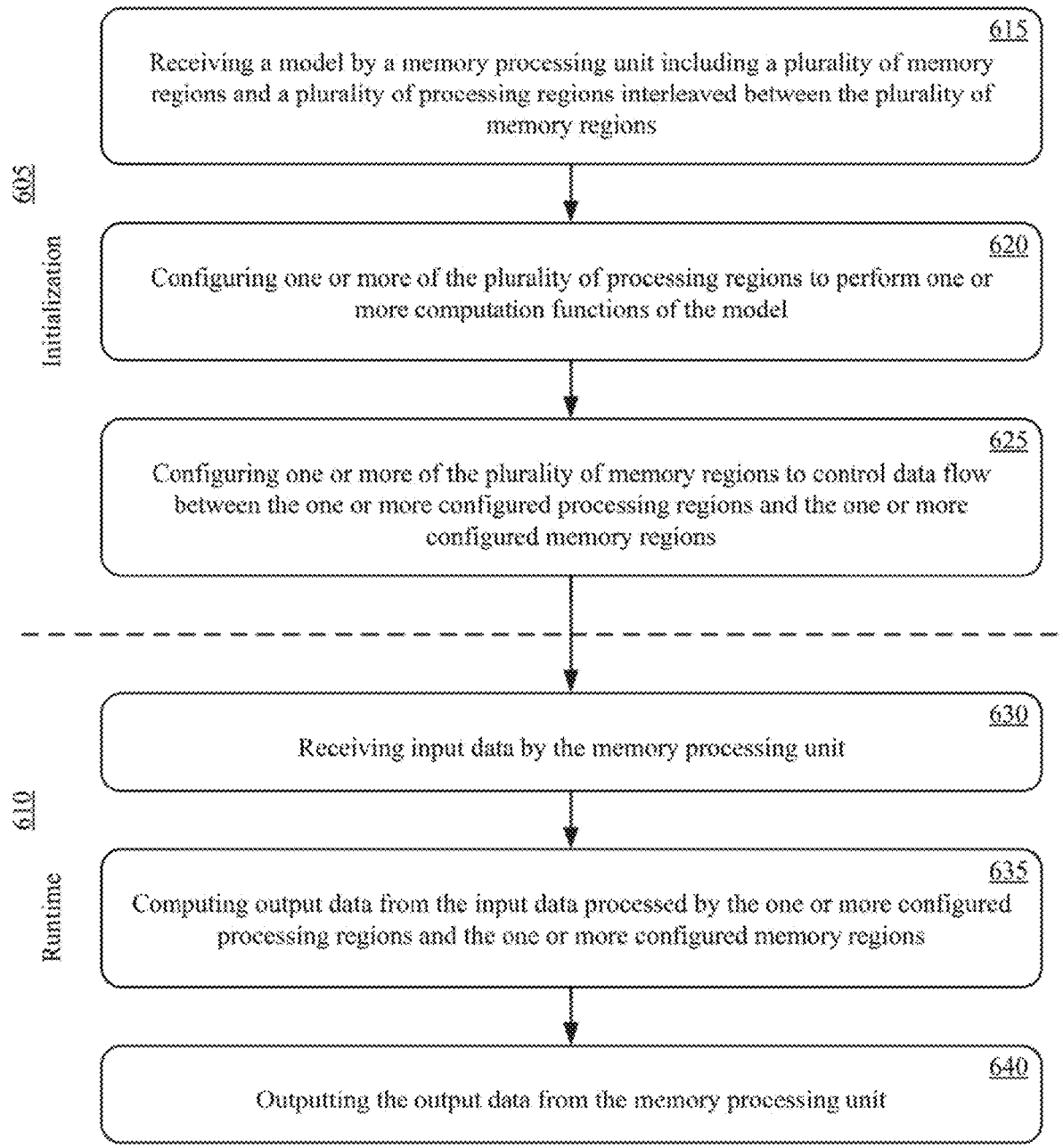
FIG. 6 shows a memory processing method, in accordance with aspects of the present technology.

Referring now to FIG. 6, a memory processing method, in accordance with aspects of the present technology, is shown. The method can be implemented in a combination of hardware, such as one or more finite state machines, and software, such as computing device-executable instructions. The memory processing method can include an initialization phase 605 and a runtime phase 610.

In the initialization phase 605, a model can be received by a memory processing unit, at 615. The memory processing unit can include a plurality of memory regions and a plurality of processing regions interleaved between the plurality of memory regions as described above with reference to FIGS. 1-5. The model can include one or more computation functions. In one implementation, the model can be a machine learning algorithm, artificial neural network, a convolution neural network, a recurrent neural network, or the like.

At 620, one or more of the plurality of processing regions of the memory processing unit can be configured to perform one or more computation functions of the model. In one implementation, a given processing region can be configured to perform one or more computation functions. For example, a given processing region can be configured by writing a first matrix comprising a plurality of weights to the array of memory cells of the given processing region. The corresponding input, counters, accumulators, shift registers, output registers and the like of the given processing region can also be configured with initial values, states or the like. In another implementation, a given processing core of a given processing region can be configured to perform a given computation function. For example, a given processing core of a given processing region can be configured by writing a first matrix comprising a plurality of weights to the array of memory cells of the given processing core. The corresponding input, counters, accumulators, shift registers, output registers and the like of the given processing core can also be configured with initial values, states or the like.

At 625, one or more of the plurality of memory regions can be configured to control data flow between the one or more configured processing regions and the one or more configured memory regions. In one implementation, for a given processing region 140, data can be configured to flow in from a first adjacent memory portion 115 and out to a second adjacent memory portion 120, either unidirectionally or bidirectionally. In another implementation, for a given processing core of a given processing region 140, data can be configured to flow in from a first adjacent memory portion 115 or a first adjacent processing core, and out to a second adjacent memory portion 120 or second adjacent processing core.

In the runtime mode 610, input data can be received by the memory processing unit, at 630. At 635, output data can be computed from the input data processed by the one or more configured processing regions and the one or more configured memory regions. At 640, the output data can be output from the memory processing unit.

Figure 7:
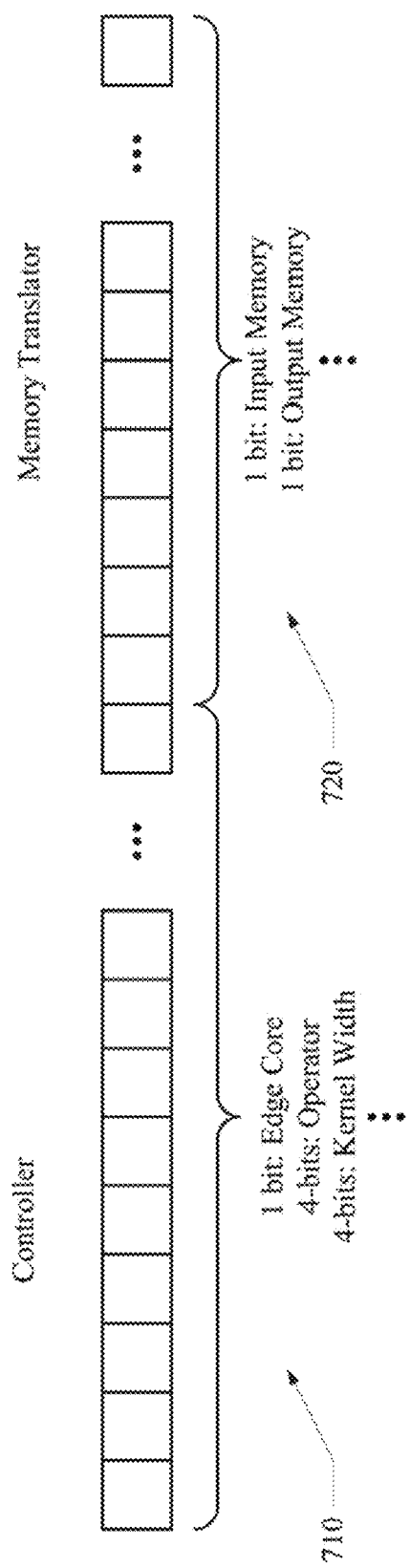
FIG. 7 shows exemplary configuration data, in accordance with aspects of the present technology.

Referring now to FIG. 7, exemplary configuration data, in accordance with aspects of the present technology, is shown. In the initialization mode 605, a configuration stream can be generated to configure the processing regions and memory regions. The configuration stream can include data 710 for use by the one or more controller 340 of the processing core 300 that can include one or more bits indicating whether the processing core 300 is configured as an edge core producing edge outputs for output to a corresponding adjacent memory region, or as a partial sum core producing partial sums for output to another processing core in a given processing region. The configuration stream can also include one or more bits indicating the computation function performed by the processing core 300. The configuration stream can also include one or more bits indicating a kernel width of the processing element 310. The configuration stream can also include data 720 for use by the one or more memory translators that include one or more bits indicating the adjacent memory region providing input data and one or more bits indicating the adjacent memory region to which output data is sent. In one implementation, a software layer of the control circuitry can be configured to receive a neural network model and generate the configuration stream.

Figure 8A:
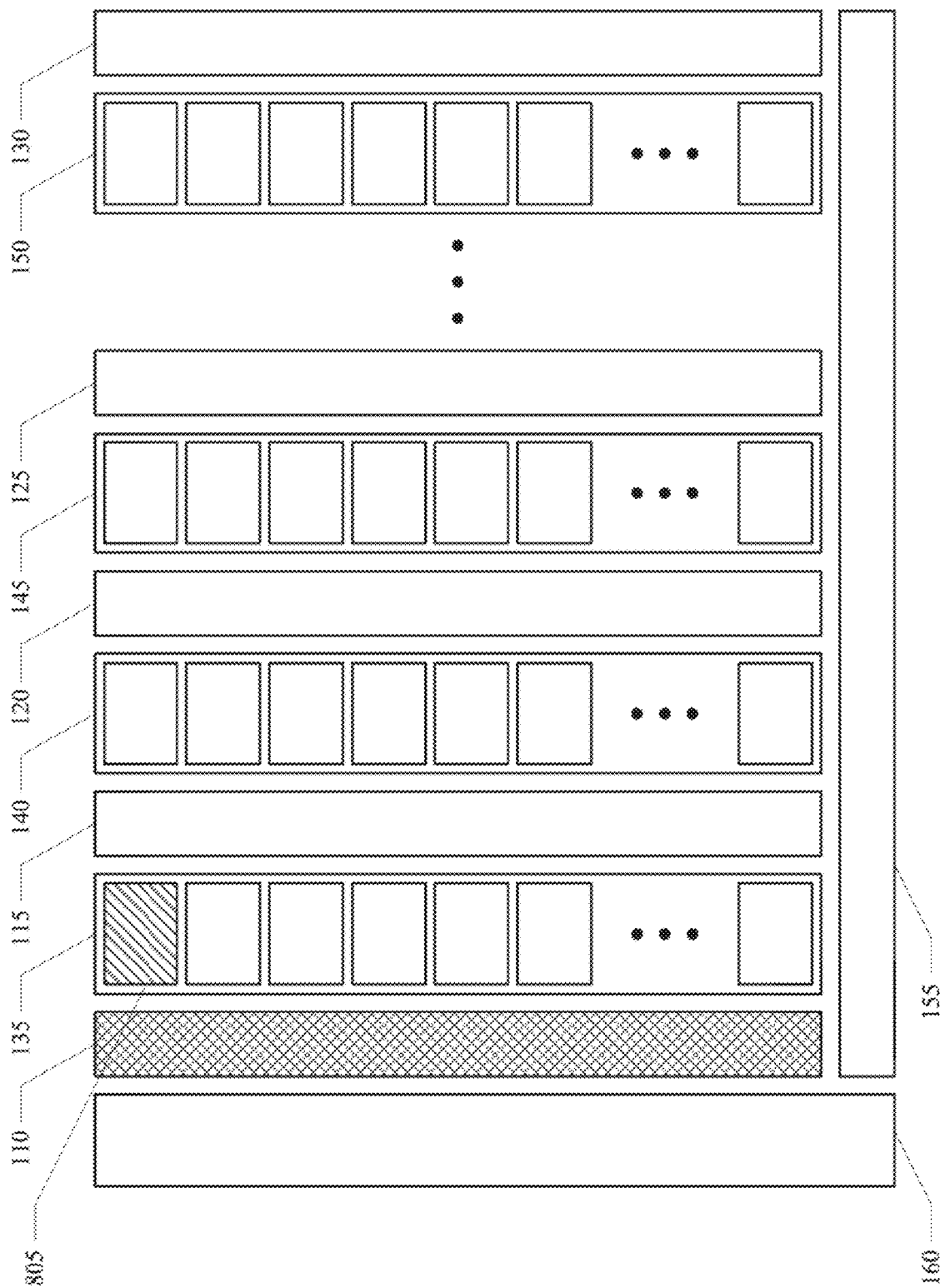

Referring now to FIGS. 8A-8J, operation of a memory processing unit, in accordance with aspects of the present technology, is illustrated. After the configuration mode, input data can be received in a first memory region 110. A first frame of data can flow from the first memory region 110 to a first processing region 135 where the first processing core 805 can perform a configured computation function on the first frame of data to generate a first instance of a first partial sum, as illustrated in FIG. 8A.

Figure 8B:
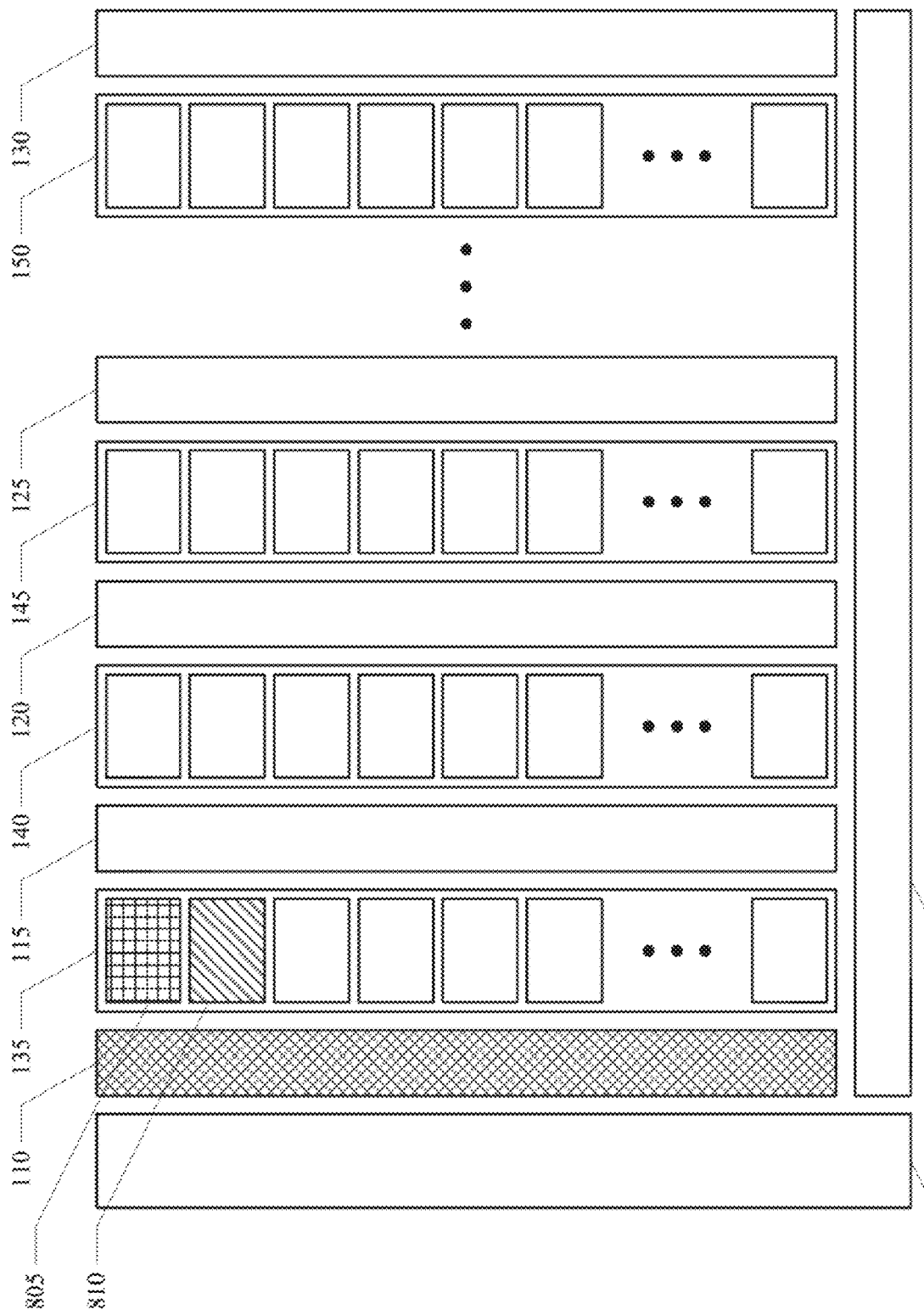
Figure 8C:
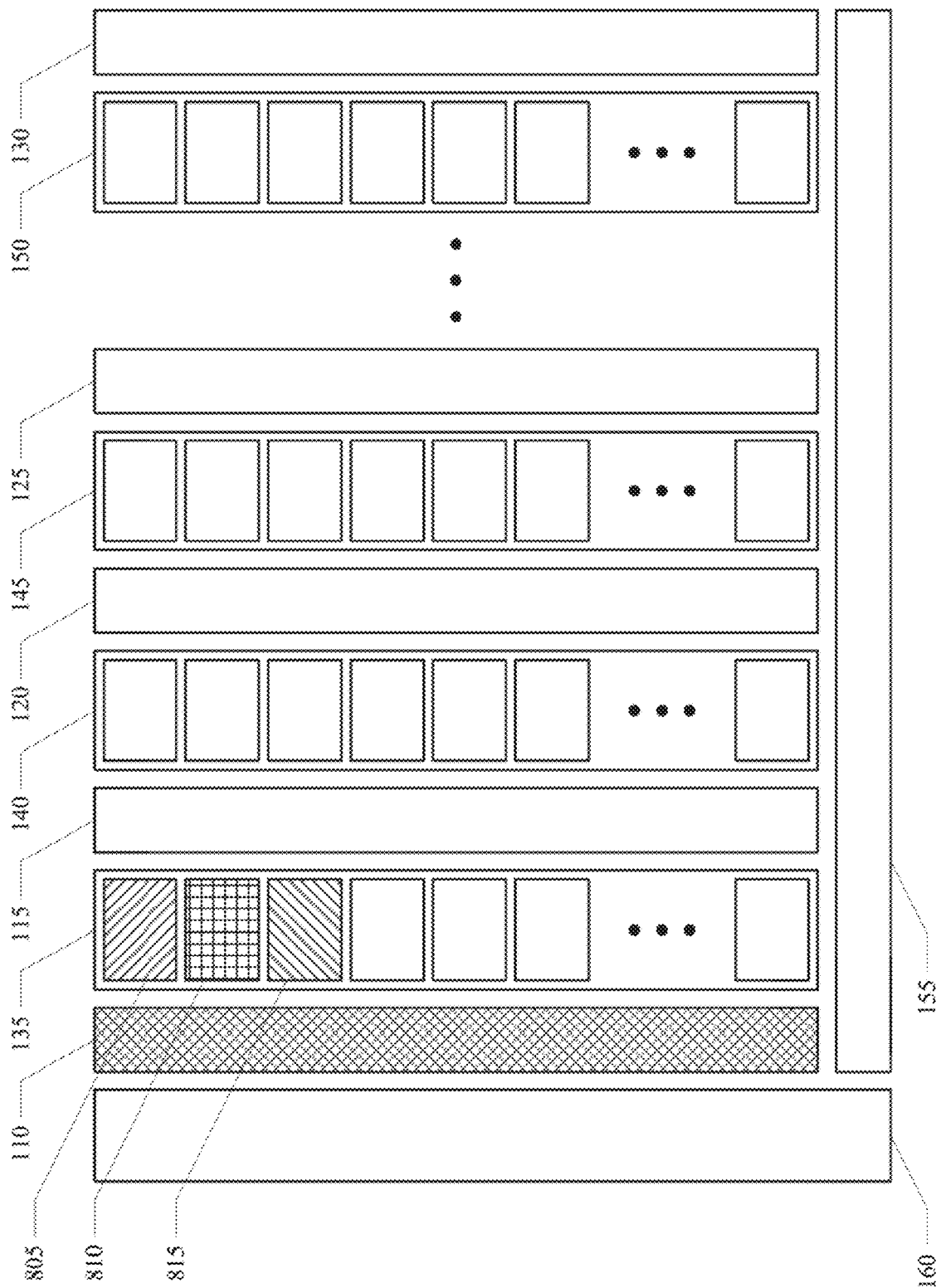

As illustrated in FIG. 8B, the first instance of the first partial sum can flow from the first processing core 805 to a second processing core 810. The second processing core 810 can perform a configured computation function on the first instance of the first partial sum. While the second processing core 810 is processing the partial sum associated with the first frame of the data, the first processing core 805 can be processing a second frame of the data. As illustrated in FIG. 8C, the first instance of the second partial sum can flow from the second processing core 810 to a third processing core 815. The third processing core 815 can perform a configured computation function on the first instance of the second partial sum to produce a first instance of a third partial sum. While the third processing core 815 is processing the partial sum associated with the first frame of data, the second processing core 810 can be processing the partial sum associate with the second frame of data and the first processing core 805 can be processing a partial sum associate with a third frame of data. As illustrated in FIG. 8D, the first instance of the third partial sum can flow from the third processing core 815 to a fourth processing core 820. The fourth processing core 820 can perform a configured computation function on the first instance of the third partial sum to produce a first instance of a first edge output. While the fourth processing core 820 is processing the partial sum associate with the first frame, the first, second and third processing cores 805-815 can be processing respective partial sums associate with respective frames of the data from the first memory region 110. It is to be appreciated that the frames of data are passed and processed in a pipeline configuration.

Figure 8E:
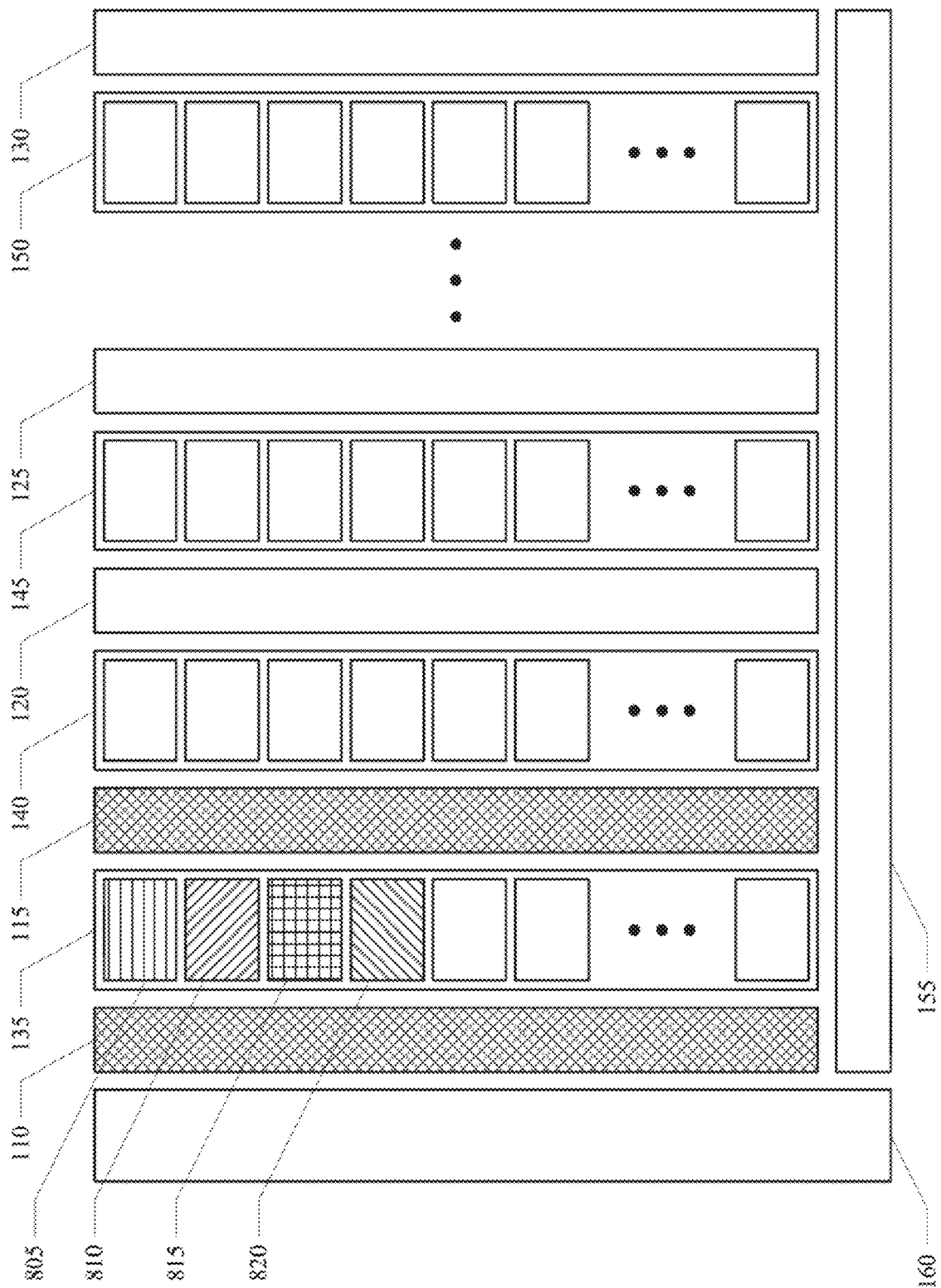
Figure 8H:
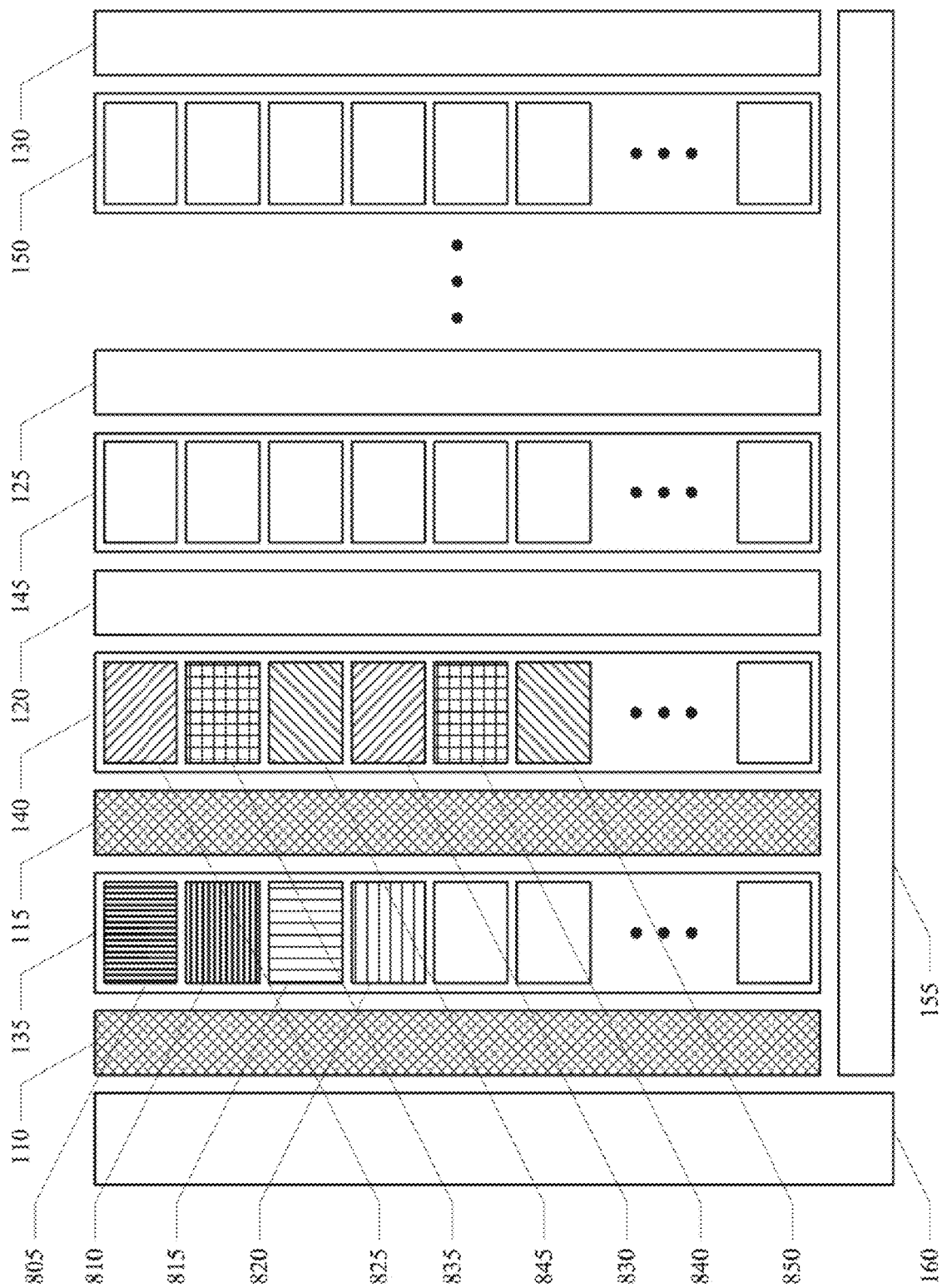
Figure 8I:
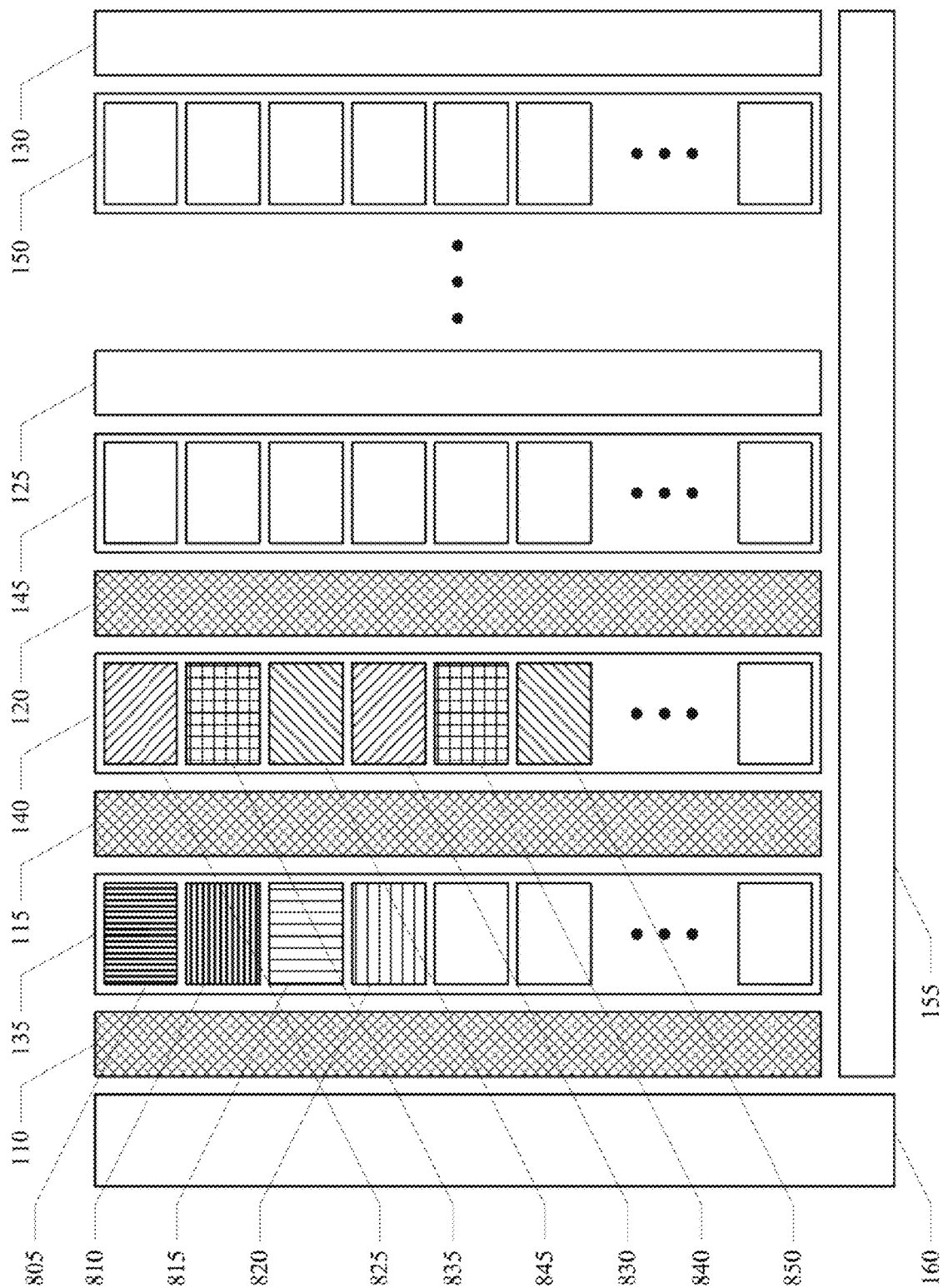
Figure 8J:
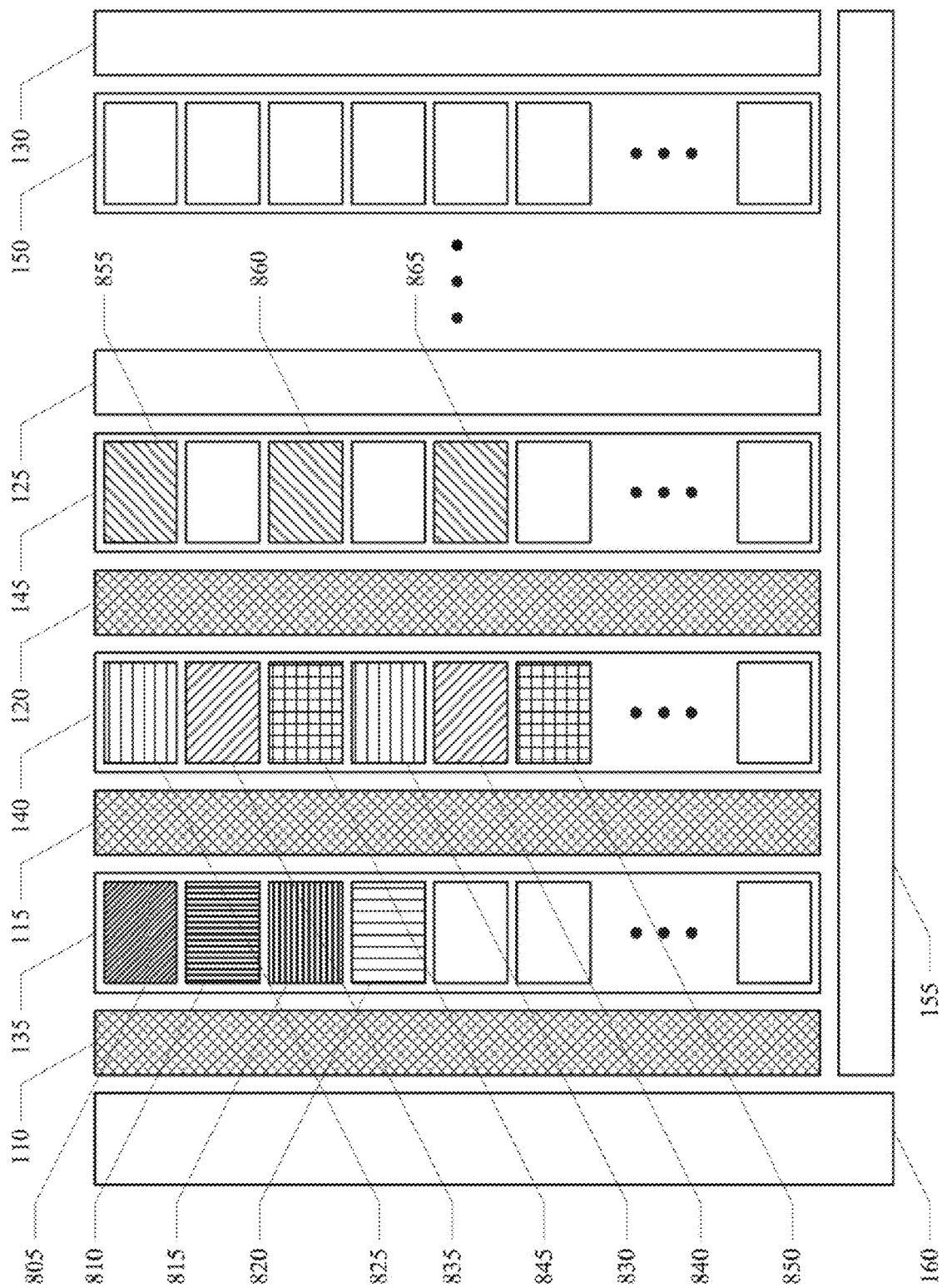

As illustrated in FIG. 8E, the fourth processing core 820 can produce an edge output that can be passed to an adjacent second memory processing region 115. The second memory processing region 115 can in turn pass the edge output to a first and a fourth processing core 825, 830 in a second processing region 140, as illustrated in FIG. 8F. Accordingly, multiple processing cores can work on the same edge output associate with a given frame of data. The one or more edge outputs output to the second memory processing region 140 can represent the output of a first layer of a neural network. As illustrated in FIG. 8G, the partial sums from the first and fourth processing cores 825, 830 in the second processing region 140 can be passed to the second and fifth processing cores 835, 840. At the same time, the first memory region 110 the first, second, third and fourth processing cores 805-820 of the first processing region 135, and the second memory region 115 can be simultaneously processing corresponding frames. The data input from the second memory region 115 to the first and fourth processing cores 825, 830 can represent the input to a second layer of the neural network. As illustrated in FIG. 8H, the partial sums from the second and fifth processing cores 825, 840 in the second processing region 140 can be passed to third and sixth processing cores 845, 850. At the same time, the first memory region 110, the first, second, third and fourth processing cores 805-820 of the first processing region 135, the second memory region 115, and the first, second, fourth and fifth processing cores 825-840 of the second processing region 140 can be simultaneously processing corresponding frames. As illustrated in FIG. 8I, the third and sixth processing cores 835, 850 of the second processing region 140 can pass edge outputs to the adjacent third memory region 120. As illustrated in FIG. 8J, the third memory region 120 can pass the edge outputs to first, third and fifth processing cores 855-865 of a third processing region 145. Accordingly, the first memory region 110, the first, second third and fourth processing cores 805-820 of the first processing region 135, the second memory region 115, the first, second, third, fourth, fifth and sixth processing cores 825-850 of the second processing region 140, the third memory region 120, and the first, third and fifth processing cores 855-865 of the third processing region 145 can be simultaneously processing corresponding frames. The configurations described above with respect to FIGS. 8A-8J are for illustrative purposes and are not intended to limit aspects of the present technology. The memory processing unit can be configurable to perform any of a variety of computations.

Accordingly, each processing core can be configured at the configuration mode to perform a specific computation function. The processing cores can continue to perform the same computation functions until a new model is mapped to the memory processing unit in a new configuration mode. Each programming element can be configured to perform a computation function, such as a Conv_2D, Dense, Conv_2D+Pooling, DW_ConV, or the like. Each processing core can be configured to generate a partial sum or an edge output. Partial sums are generally passed from one processing core to another processing core in the same processing region. Edge outputs are generally passed to a memory region.

Figure 9:
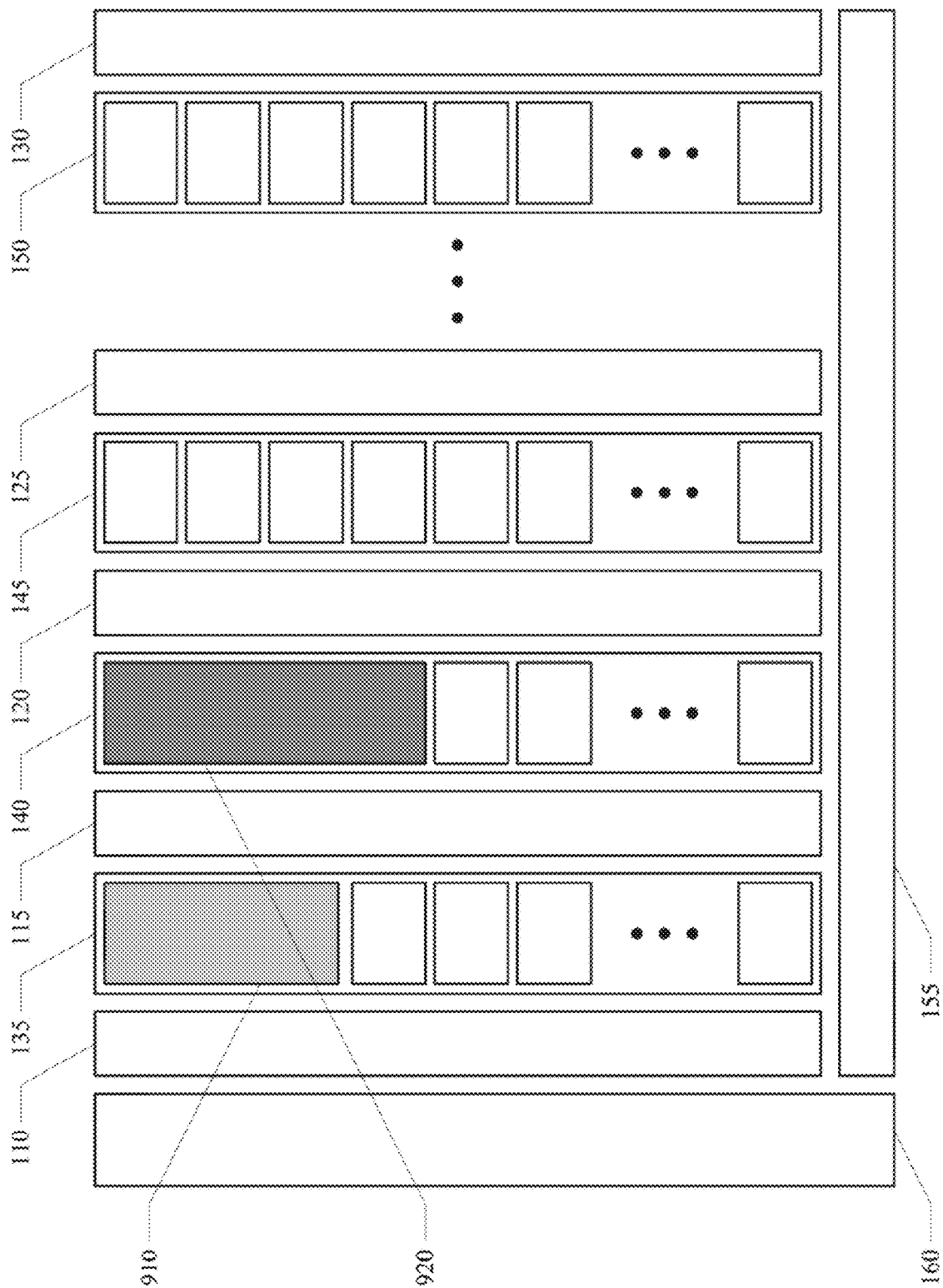
FIG. 9 illustrates configuration and operation of a memory processing unit, in accordance with aspects of the present technology.

Referring now to FIGS. 9-14, configuration and operation of a memory processing unit, in accordance with aspects of the present technology, is illustrated. In the configuration mode, each layer of a neural network can be mapped to a respective memory processing region. For example, a first layer of a neural network layer 910 can be mapped to the first processing region 135, and a second layer of the neural network layer 920 can be mapped to the second processing region 140, as illustrated in FIG. 9. In such example, the first, second and third processing cores of the first processing region 135 can perform computation functions of the first layer of the neural network layer 910. Similarly, the first, second, third and fourth processing cores of the of the second processing region 140 can perform computation functions of the second layer of the neural network layer 920.

Figure 10:
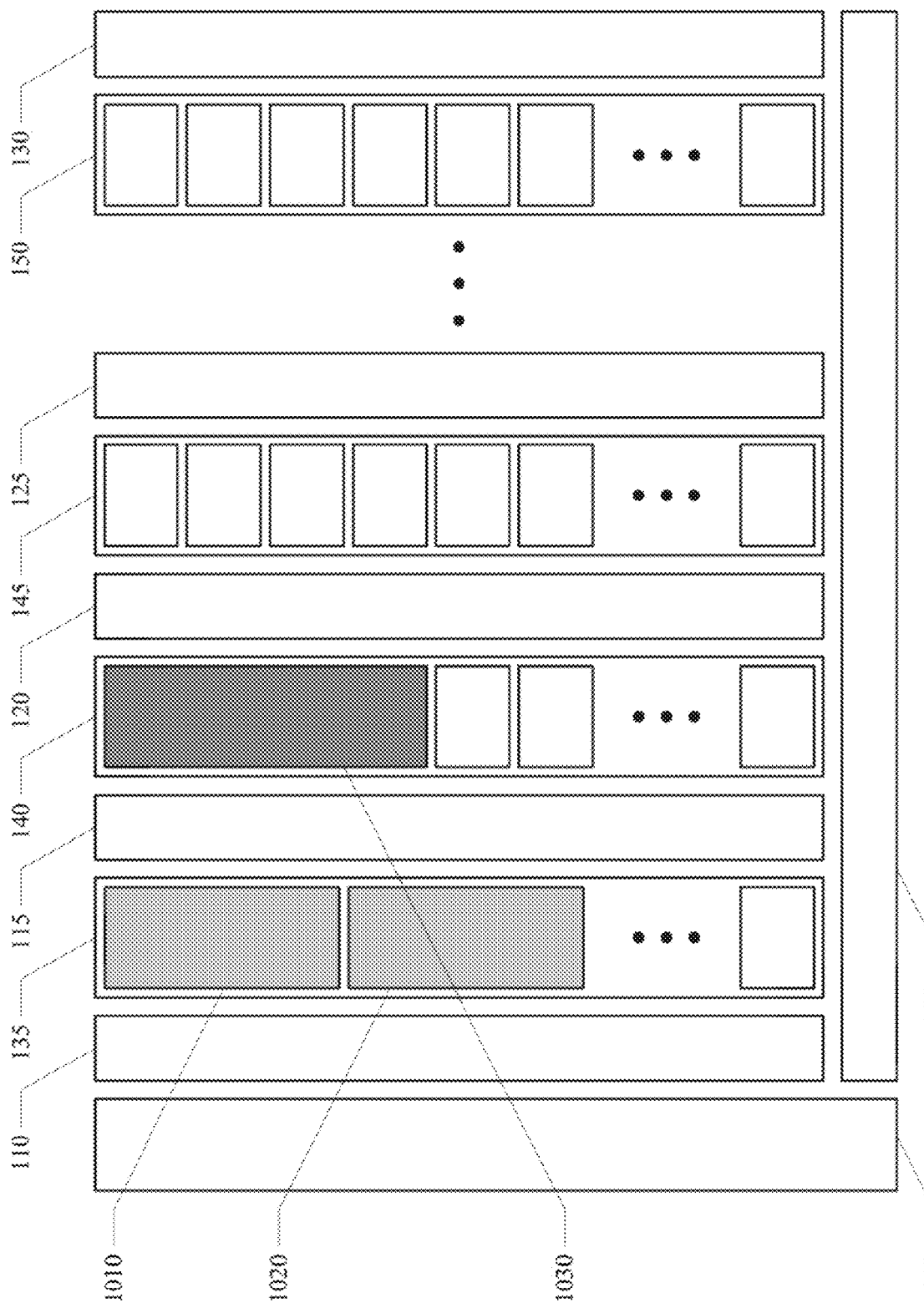
FIG. 10 illustrates configuration and operation of a memory processing unit, in accordance with aspects of the present technology.

In addition or alternatively, multiple sets of processing cores, also referred to as workers, in the same processing region can operate on the same neural network layer. For example, a first set of processing cores in the first processing region 135 can operate on a first instance of the first layer 1010, and a second set of processing cores in the first processing region 135 can operate on a second instance of the first layer 1020, as illustrated in FIG. 10. In addition, another set of processing cores in the second processing region 140 can operate on a second layer 1030.

Figure 11:
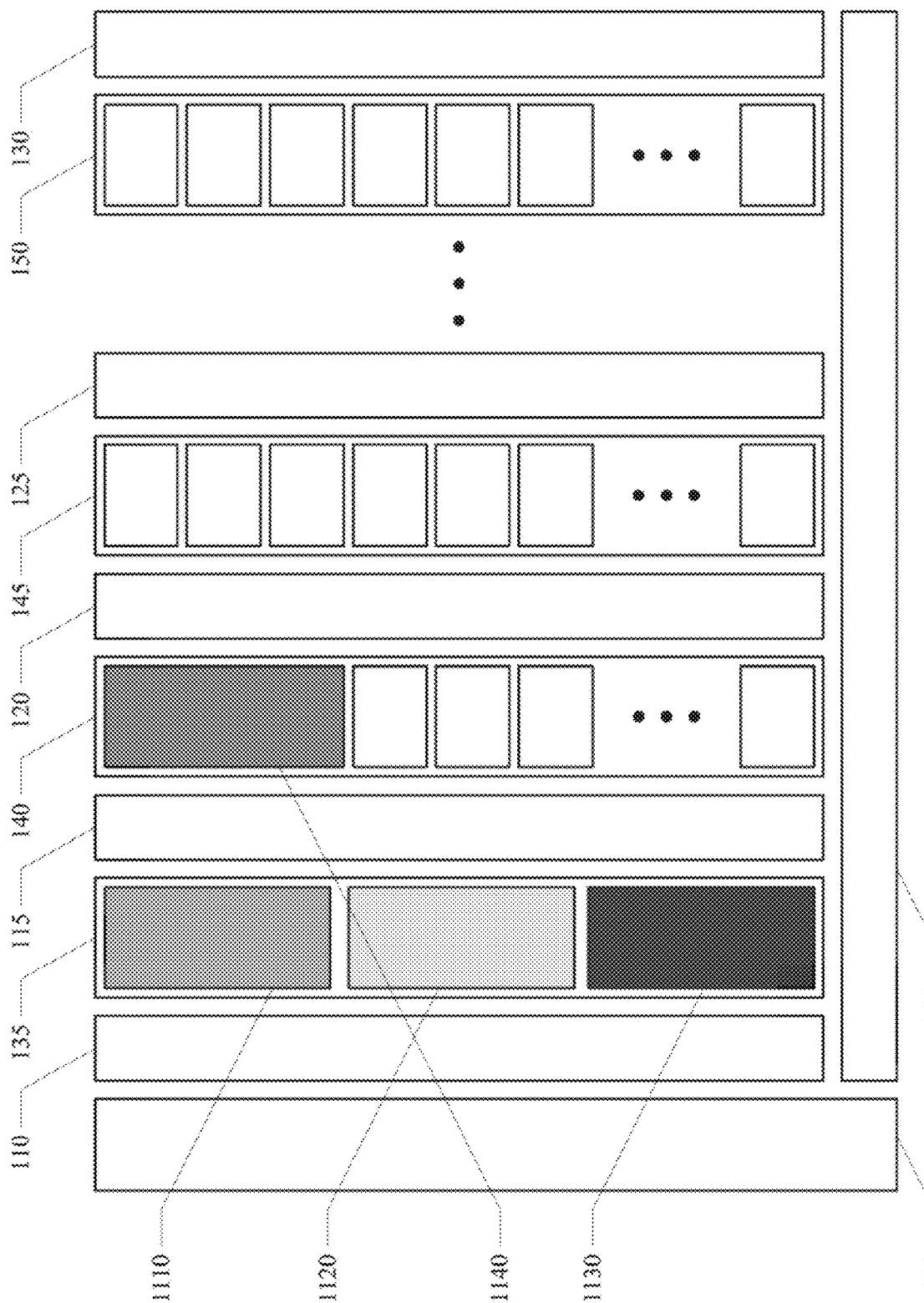
FIG. 11 illustrates configuration and operation of a memory processing unit, in accordance with aspects of the present technology.

In addition or alternatively, multiple neural network layers can be mapped to the same processing region. For example, a first set of processing cores in the first processing region 135 can operate on a first layer 1110, a second set of processing cores in the first processing region 135 can operate on a second layer 1120, and a third set of processing cores in the first processing region 135 can operate on a third layer 1130, as illustrated in FIG. 11. If the first processing region 135 is utilized as much as possible by the first, second and third layers 1110-1130, a fourth layer 1140 can then be mapped to a first set of processing cores in the second processing region 140. Mapping multiple smaller layers to a single memory region can increase the utilization of the memory regions in the memory processing unit.

Figure 12:
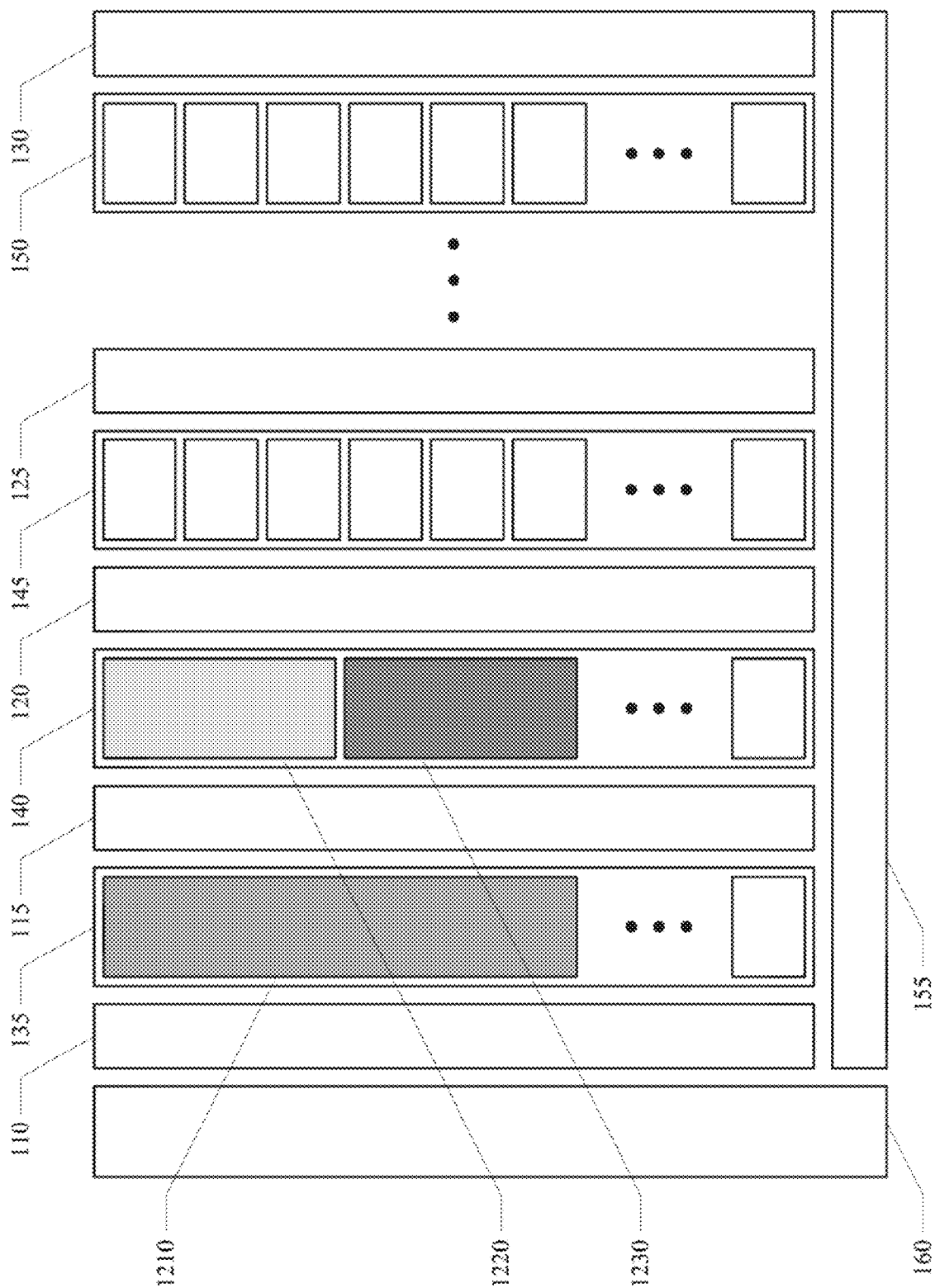
FIG. 12 illustrates configuration and operation of a memory processing unit, in accordance with aspects of the present technology.

In addition or alternatively, branching can be natively implemented in mapping the neural network. For example, a first layer 1210 can be mapped to a set of processing cores in the first processing region 135. A first branch of a second layer 1220 can be mapped to a first set of processing cores in the second processing region 140, and a second branch of the second layer 1230 can be mapped to a second set of processing cores in the second processing region 140, as illustrated in FIG. 12. The data from the first layer 1210 can be passed by the second memory region 115 to the appropriate branch of the second layer 1220, 1230.

Figure 13:
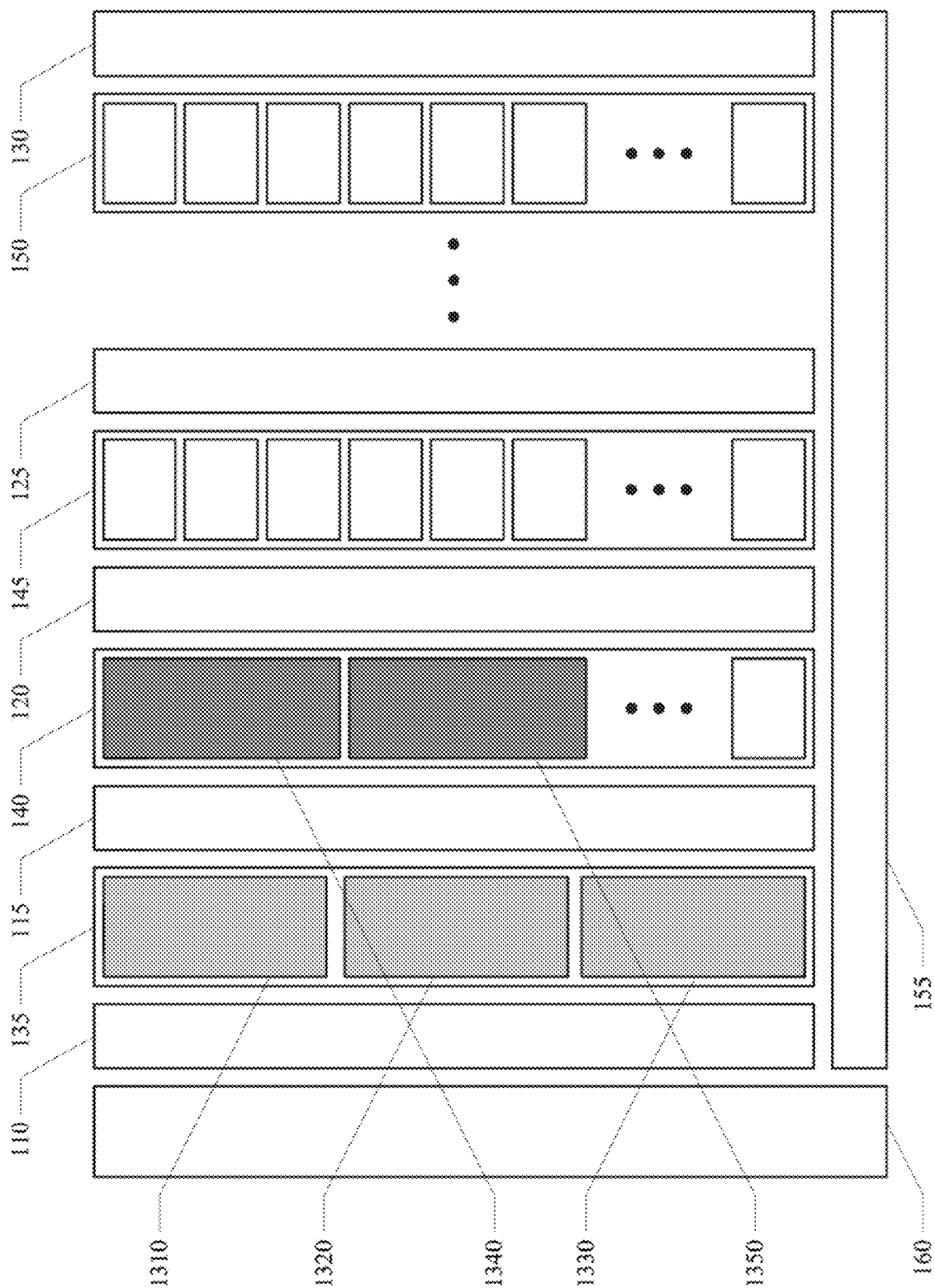
FIG. 13 illustrates configuration and operation of a memory processing unit, in accordance with aspects of the present technology.
Figure 14:
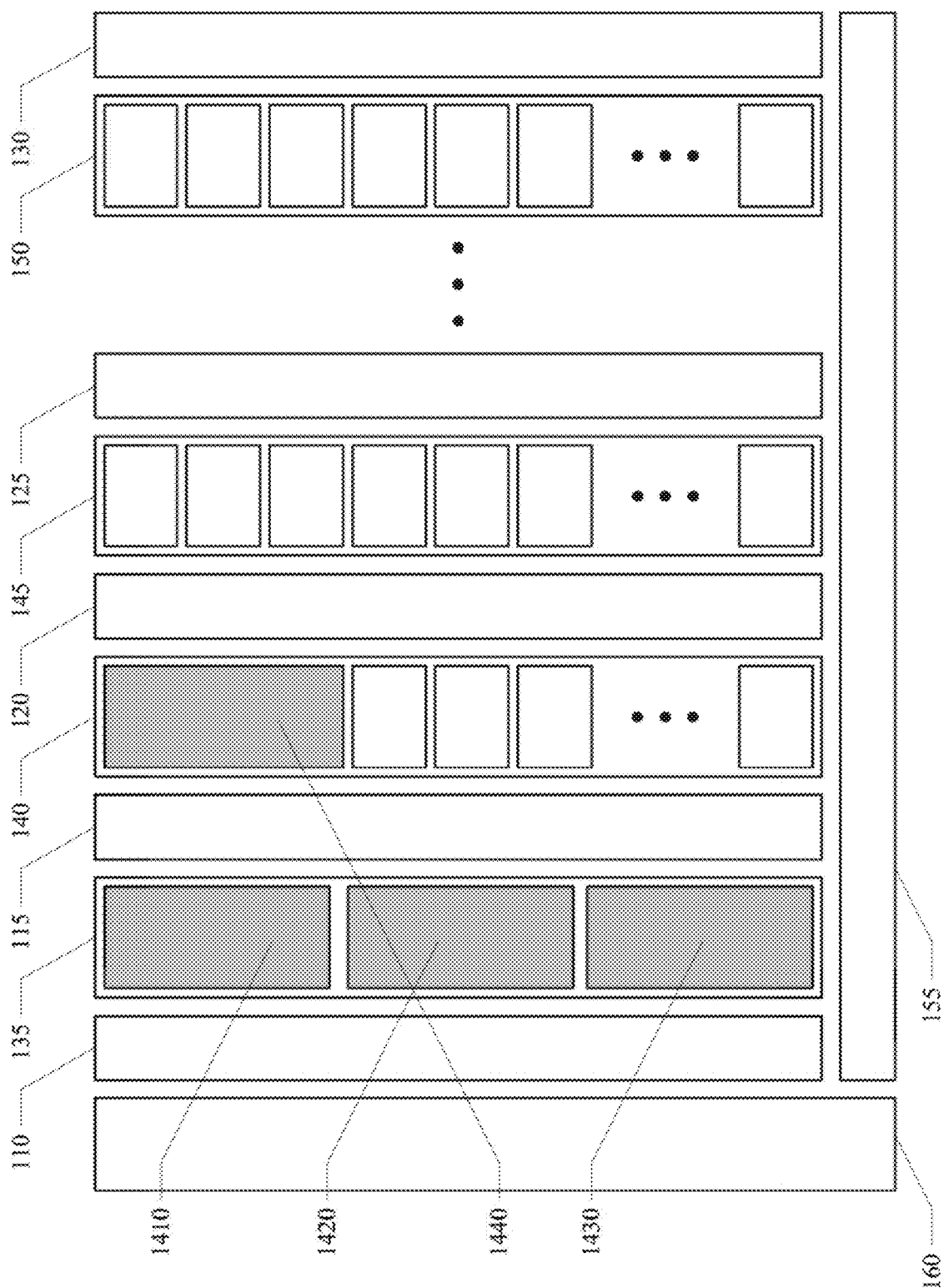
FIG. 14 illustrates configuration and operation of a memory processing unit, in accordance with aspects of the present technology.

In addition or alternatively, a relatively wide layer of a neural network can be split and mapped to a plurality of sets of processing cores of one or more memory regions. In a first example, as illustrated in FIG. 13, a first layer can be split into three portions 1310-1330 and a second layer can be split into two portions 1340, 1350. The first portion of the first layer 1310 can be mapped to a first set of processing cores of the first processing region 135, a second portion of the first layer 1320 can be mapped to a second set of processing cores of the first processing region 135, and a third portion of the first layer 1330 can be mapped to a third set of processing cores of the first processing region 135. Similarly, the first portion of the second layer 1340 can be mapped to a first set of processing cores of the second processing region 140, and a second portion of the second layer 1350 can be mapped to a second set of processing cores of the second processing region 140. In another example, a layer can be split into four portions, as illustrated in FIG. 14. A first portion of the layer 1410 can be mapped to a first set of processing cores of the first processing region 135, a second portion of the layer 1420 can be mapped to a second set of processing cores of the first processing region 135, a third portion of the layer 1430 can be mapped to a third set of processing cores of the first processing region 135, and a fourth portion of the layer 1440 can be mapped to a first set of processing cores of the second processing region 140. The configurations described above with respect to FIGS. 9-14 are for illustrative purposes and are not intended to limit aspects of the present technology. The memory processing unit can be configurable to perform any of a variety of computations.

Figure 15:
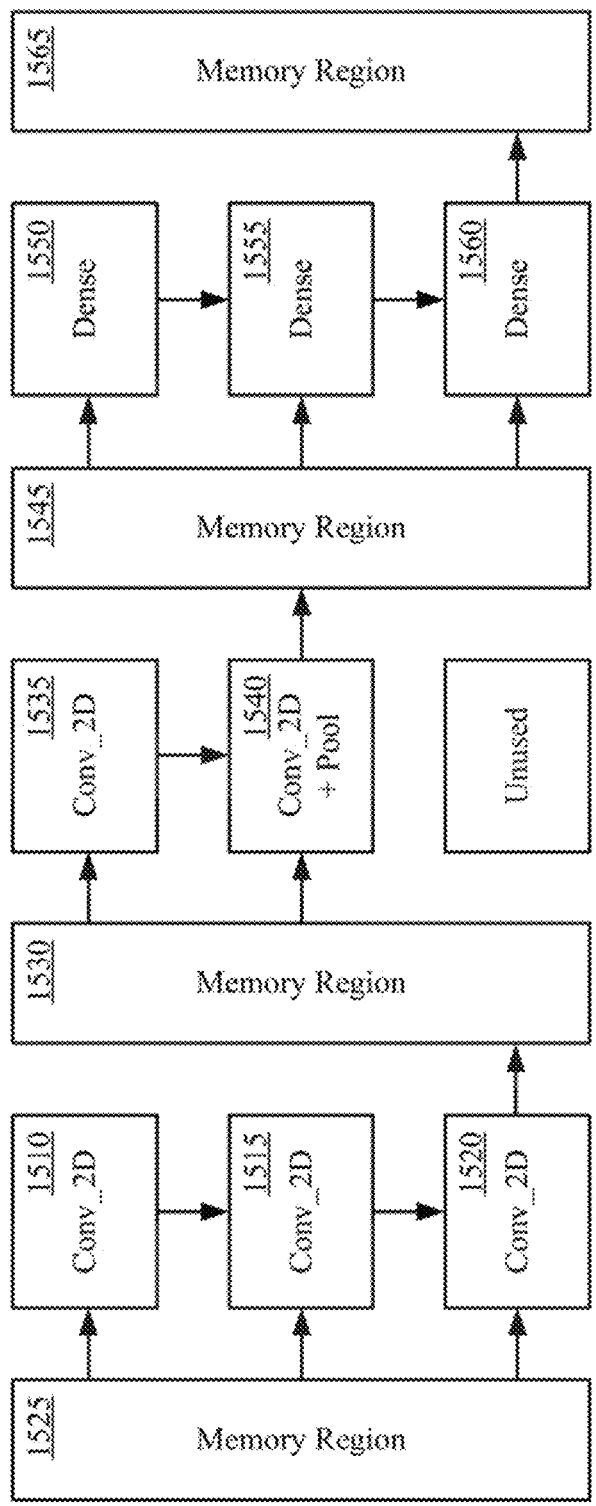
FIG. 15 illustrates configuration and operation of a memory processing unit, in accordance with aspects of the present technology.

Referring to FIG. 15, configuration and operation of a memory processing unit, in accordance with aspects of the present technology, is illustrated. A first, second and third processing core 1510-1520 of a first processing region can be configured to receive data from a first memory region 1525. The first processing core 1510 can be configured to perform a 2D convolution on data received from the first memory region 1525 and generate a partial sum that is fed to the second processing core 1515. The second processing core 1515 can be configured to perform a 2D convolution on data received from the first memory region 1525 and the partial sum from the first processing core 1510 and generate a partial sum that is fed to the third processing core 1520. The third processing core 1520 can be configured to perform a 2D convolution on data received from the first memory region 1525 and the partial sum received from the second processing core 1515, and generate an edge output that is output to a second memory region 1530. The data received from the first memory region 1525 can be for example be a plurality of frames of image data.

A first processing core 1535 of the second processing region can be configured to receive data from the second memory region 1530 and perform a 2D convolution to generate a partial sum that is fed to a second processing core 1540. The second processing core 1540 of the second processing region can be configured to perform a 2D convolution with max pooling on data received from the second memory region 1530 and the partial sum received from the first processing core 1535 to generate an edge output that is output to a third memory region 1545.

A first processing core 1550 of the third processing region can be configured to receive data from the third memory region 1545 and perform a fully-connected dense matrix product to generate a partial sum that is fed to a second processing core 1555. The second processing core 1555 of the third processing region can be configured to perform a fully-connected dense matrix product on data received from the third memory region 1545 and the partial sum from the first processing core 1550 to generate a partial sum that is output to a third processing core 1560. The third processing core 1560 of the third processing region can be configured to perform a fully-connected dense matrix product on data received from the third memory region 1545 and the partial sum from the second processing core 1555 to generate an edge output that is output to a fourth memory region 1565. The above described set of computations is for illustrative purposes and is not intended to limit aspects of the present technology. The memory processing unit can be configurable to perform any of a variety of computations.

Figure 16:
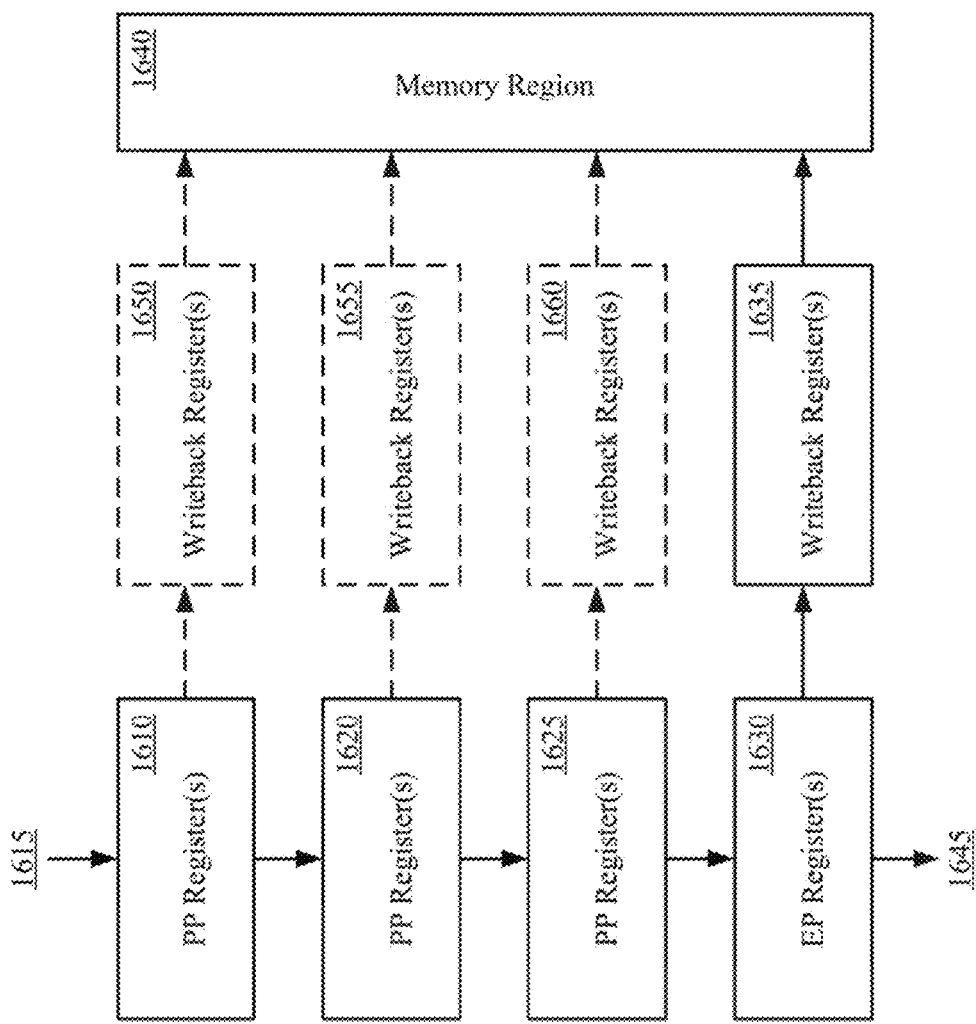
FIG. 16 illustrates a data flow through a set of processing cores in a processing region, in accordance with aspects of the present technology.

Referring now to FIG. 16, a data flow through a set of processing cores in a processing region, in accordance with aspects of the present technology, is illustrated. The one or more partial sum registers 1610 of a first processing core can be initialized with a given value 1615, such as all zeros. After the given computation function of the first processing core is performed in a first cycle, the value in the first partial sum registers 1610 can be passed to a second processing core. After the computation functions of the first and second processing cores are performed in a second cycle, the values in the respective partial sum registers 1610, 1620 can be passed to the second and third processing cores. After the computation functions of the first, second and third processing cores are performed in a third cycle, the values in the respective partial sum registers 1610, 1620, 1625 can be passed to the second, third and fourth processing cores. After the computation functions of the first, second, third and fourth processing cores are performed in a fourth cycle, the values in the respective partial sum register 1610, 1620, 1625 can be passed to the second, third and fourth processing cores. In addition, the values in the one or more edge output registers 1630 of the fourth processing core can be passed to one or more corresponding writeback register 1635 of the fourth processing core. The writeback registers 1635 allow the values to be written out to a corresponding adjacent memory region 1640, while the next set of partial sums are passed from partial sum register 1625 of the third processing core to the fourth processing cores in a fourth cycle. Optionally, the edge output registers 1630 of the fourth processing core can be set to a given value 1645, such as all zeros, when the partial sum values are passed to the corresponding writeback registers 1635, so that a given value can be passed to a next processing core when partial sums are passed in the fourth cycle. As illustrated in FIG. 16, the writeback registers 1635 of the fourth processing core that generates edge outputs are activated, while the writeback register 1650-1660 of the first, second and third processing cores that generate partial sums are disabled. In a neural network or other similar application, the plurality of processing cores in a processing region can generate a very large amount of data for output to a corresponding adjacent memory region. The writeback registers 1635 coupled to edge output registers 1630 can provide for writing the very large amount of data out to the corresponding adjacent memory region 1640 without the need to stop or stall the processing in the plurality of processing cores. The configurations described above with respect to FIG. 16 is for illustrative purposes and is not intended to limit aspects of the present technology. The set of processing cores can be configurable in any of a variety of ways to perform computations.

Figure 17A:
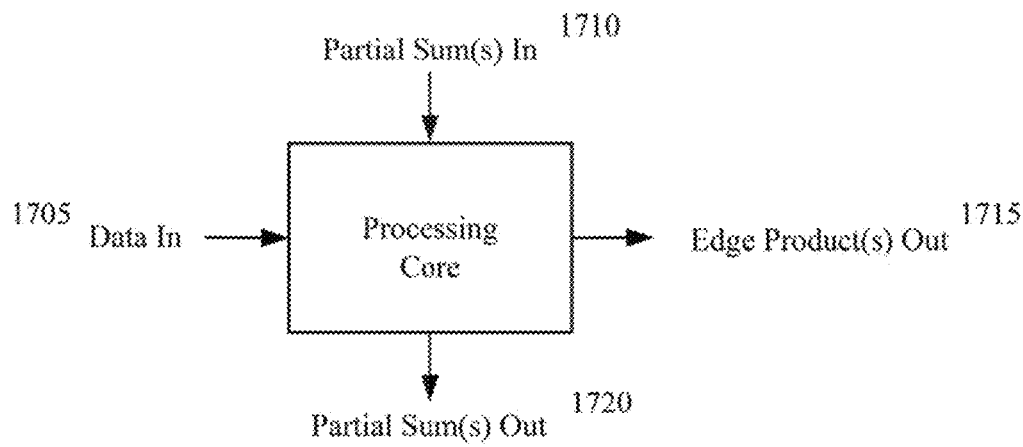
FIGS. 17A and 17B illustrate data flow configurations of a processing core, in accordance with aspects of the present technology.
Figure 17B:
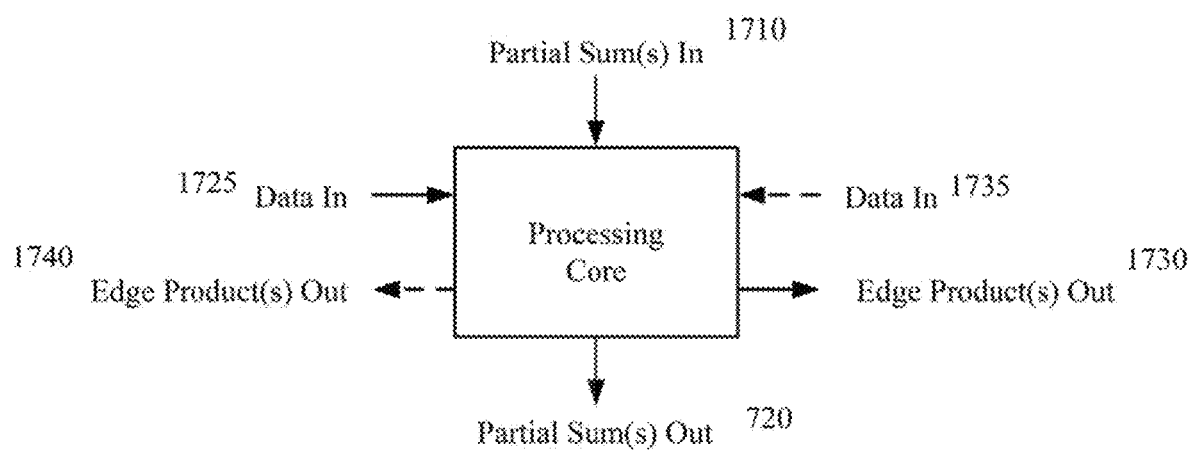

Referring now to FIGS. 17A and 17B, data flow configurations of a processing core, in accordance with aspects of the present technology, are illustrated. As illustrated in FIG. 17A, data can be configured to flow in from the left 1705, partial sums can flow in from the top 1710, and edge outputs can flow out to the right 1715. Alternatively, data can flow in from the left 1705, partial sums can flow in from the top 1710, and partial sums can flow out the bottom 1720. In such examples, data flow is unidirectional from left to right and from top to bottom. In other examples, data and edge outputs can flow unidirectionally from right to left (not shown). Data configured to flow unidirectionally through the processing cores can be used for implementing a deep convolution neural network, that include forward data propagation.

Alternatively, the processing core can be configured so that data flows in from the left 1725 and edge outputs flow out to the right 1730, or data flows in from the right 1735 and edge outputs flow out to the left 1740, as illustrated in FIG. 17B. In such an example, data flow is bidirectional from left to right, and right to left. Data configured to flow bidirectionally through the processing cores can be used for implementing a recurrent neural network, that includes forwards and backward data propagation.

Figure 18:
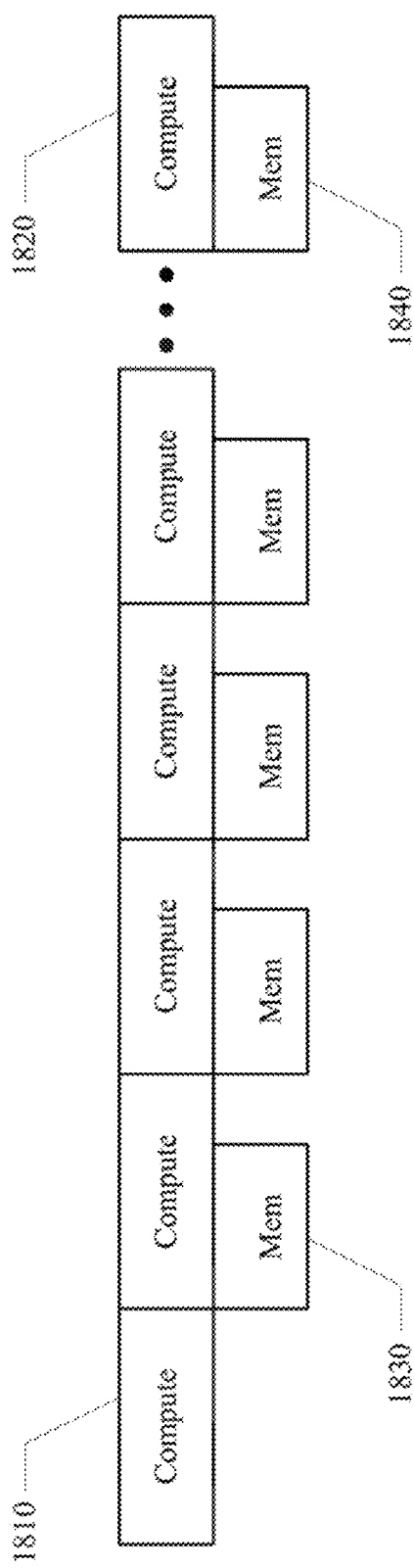
FIG. 18 illustrate a conventional computing process.
Figure 19:
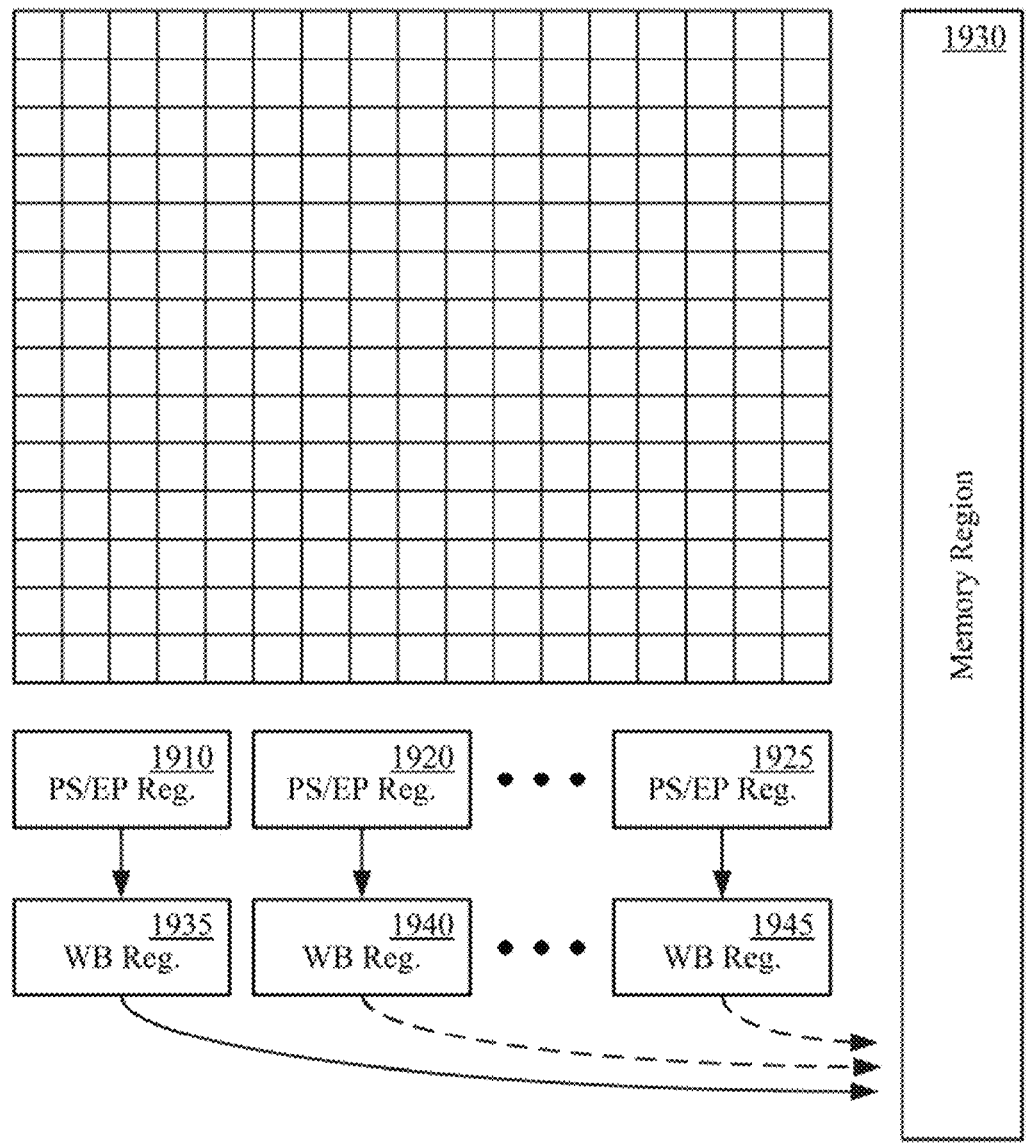
FIG. 19 shows a processing core, in accordance with aspects of the present technology.

Referring now to FIG. 18, a conventional computing process is illustrated. In a conventional computer processor, the computation functions of a neural network are performed by instructions that are executed sequentially to perform a compute operation 1810-1820 on a data value with the result written back to memory 1830-1840. The compute operations and write back of results to memory are sequentially performed. In comparison, as illustrated in FIG. 19, the memory processing unit 1900 in accordance with aspects of the present technology, can compute a plurality of partial sums and edge outputs using a combination 1910-1925 thereof in parallel with each other without the need to write to memory 1930. In addition, the use of writeback register 1935-1945 can hide the latency of writing edge outputs, and optionally partial sums, to an adjacent memory region 1930.

Figure 20A:
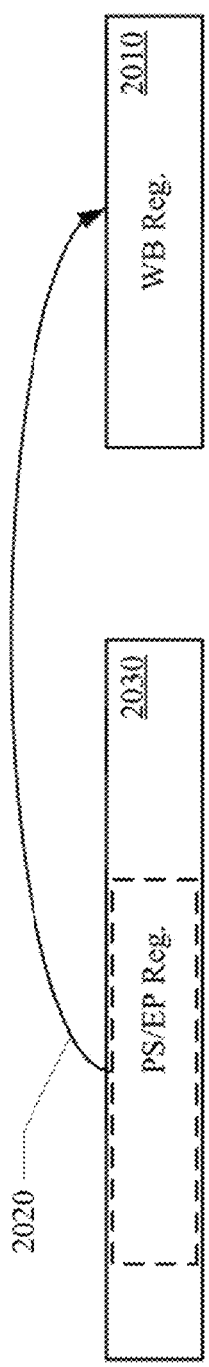
FIGS. 20A and 20B show writeback register, in accordance with aspects of the present technology.
Figure 20B:
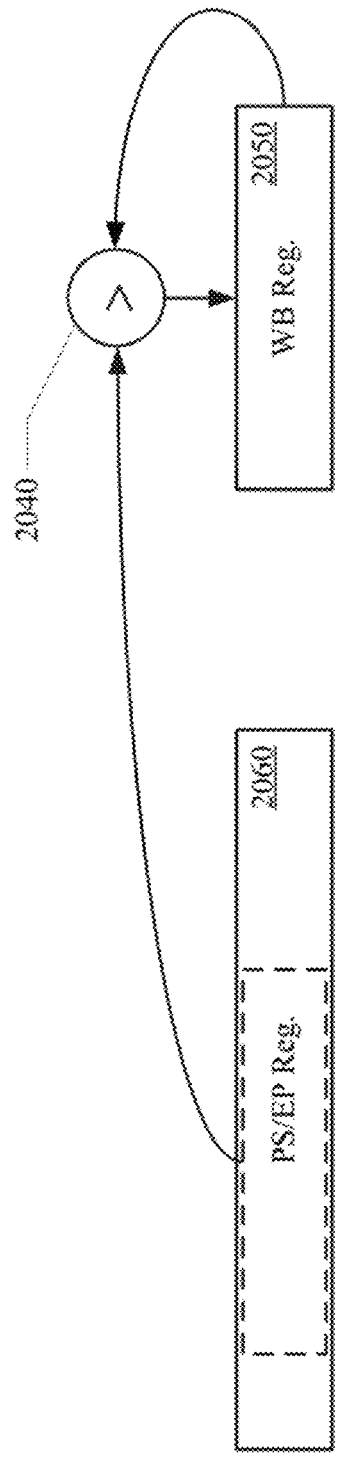

Referring now to FIGS. 20A and 20B, a writeback register, in accordance with aspects of the present technology, is shown. As illustrated in FIG. 20A, a writeback register 2010 can be configured to scaling operation, also referred to as normalization, by passing a given subset of bits 2020 from an edge output register 2030 to a corresponding writeback register 2010. In addition, circuitry can be utilized in combination with a writeback register to perform other operations. For example, combinational logic 2040 can be configured to pass the greater of the current content of a partial sum register 2050 or the current content of a writeback register 2060, or a portion thereof, back to the writeback register 2050 to implement max-pooling, as illustrated in FIG. 20B. Other operations such as min-pooling, averaging, rectified linear, activation function or the like can also be implemented utilizing the partial sum register and the writeback register.

Figure 21:
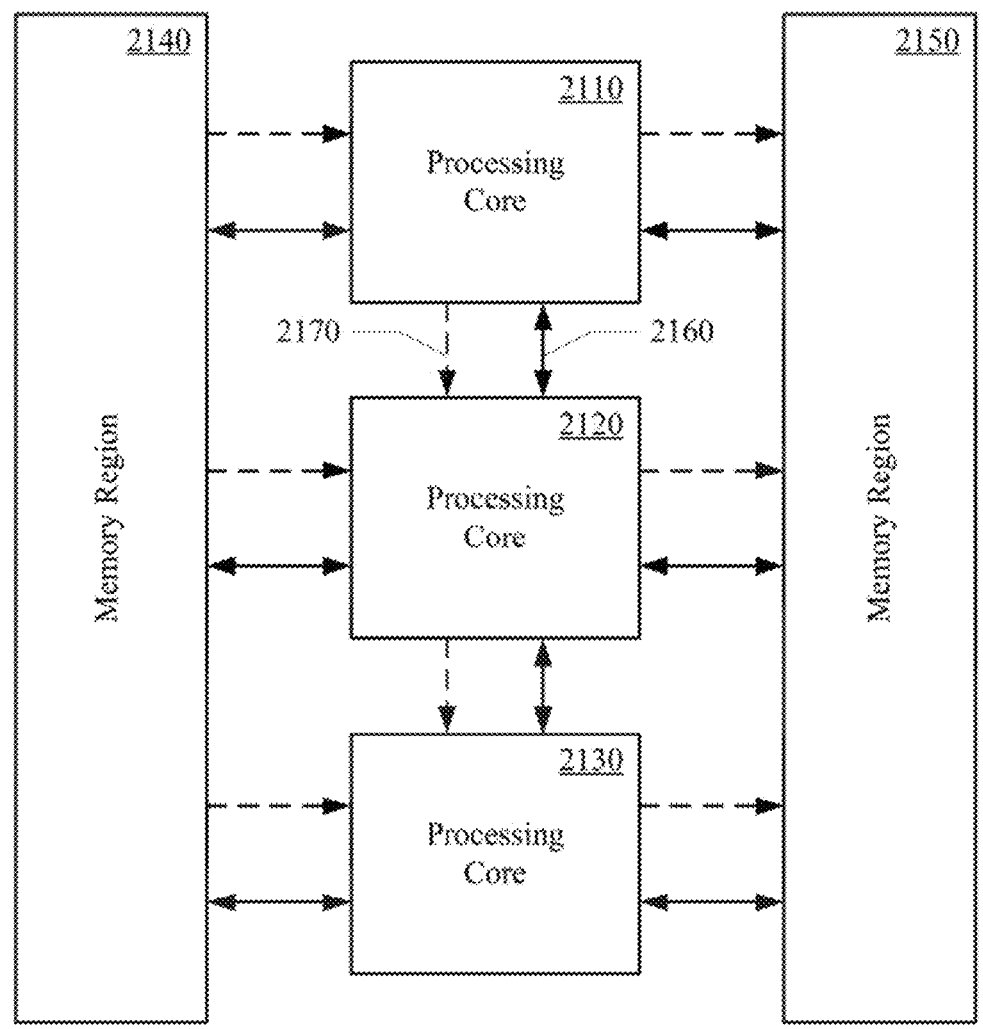
FIG. 21 illustrates data transfer in a memory processing unit, in accordance with aspects of the present technology.

Referring now to FIG. 21, data transfer in a memory processing unit, in accordance with aspects of the present technology, is illustrated. Data flow between a plurality of processing cores 2110-2130 and corresponding adjacent memory regions 2140, 2150 can be controlled utilizing handshaking rather than by a global controller. For example, a second processing core 2120 can wait until it receives a signal 2160 from a first processing core 2110 indicating that the first processing core has valid data. When the second processing core 2120 receives the signal 2160 indicating that the first processing core 2110 has valid data, the second processing core 2120 can copy 2170 the data from the first processing core 2110 and begin performing the computation function of the second processing core 2120 on the data copied from the first processing core 2110. The second processing core 2120 can also send a signal 2160 to the first processing core 2110 indicating that it has copied the data from the first processing core 2110. In response to the signal 2160 from the second processing core 2120, the first processing core 2110 can begin processing new data. The use of handshaking to control data flow can simplify the pipeline operation of the plurality of processing cores 2110-2130 and corresponding adjacent memory regions 2140, 2150. For example, with handshaking, a central control logic is not needed to keep track of stalls in various processing cores 2110-2130.

Figure 22:
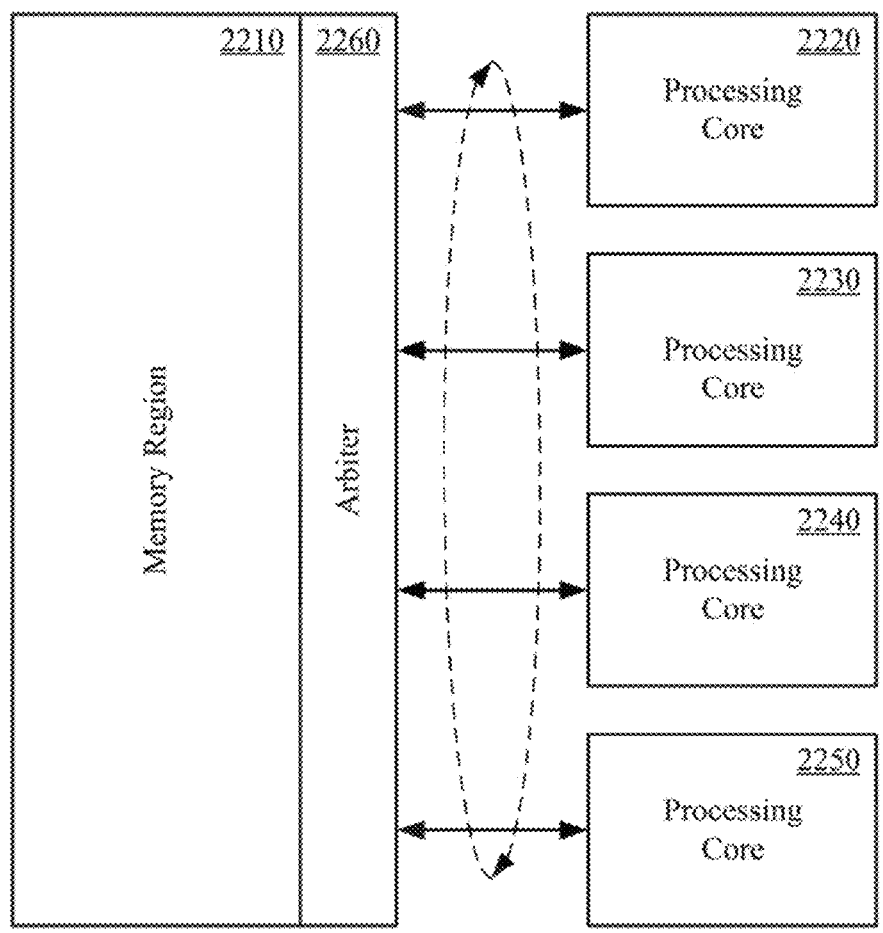
FIG. 22 illustrates data transfer in a memory processing unit, in accordance with aspects of the present technology.

Referring now to FIG. 22, data transfer in a memory processing unit, in accordance with aspects of the present technology, is illustrated. Data flow between a corresponding adjacent memory region 2210 and a plurality of processing cores 2220-2250 can be controlled using an arbiter mechanism 2260 to facilitate the memory access. The arbiter 2260 can provide for access to a corresponding adjacent memory region 2210 by each of a plurality of processing cores 2220-2250 in turn. In addition, the memory region 2210 can utilize a multi-bank architecture to facilitate access by the plurality of processing cores 2220-2250. Each bank can support access by a corresponding processing core, so that the plurality of processing cores 2220-2250 can access the memory region 2210 simultaneously.

Referring now to FIG. 23, data reuse in a memory processing unit, in accordance with aspects of the present technology, is illustrated. Data reuse can be implemented within the processing cores 2310 to reduce memory access. For example, if data received 2320 in the memory processing region is needed again later 2330 by the processing core 2310, the data can be maintained in the memory processing region 2310 for reuse.

Embodiments of the present technology advantageously provide a reconfigurable computing platform. The memory processing units in accordance with aspects of the present technology can perform advantageously computations directly in memory. Accordingly, aspects of the present technology can advantageously reduce processing latency, data latency and or power consumption.

The following examples pertain to specific technology embodiments and point out specific features, elements, or steps that may be used or otherwise combined in achieving such embodiments.

Example 1 includes a memory processing unit comprising: a plurality of memory regions; a plurality of processing regions interleaved between the plurality of memory regions, wherein one or more of the plurality of processing regions are configured to perform one or more computation functions; one or more communication links coupled between the interleaved plurality of memory regions and plurality of processing units, wherein the communication links are configured for moving data between non-adjacent ones of the plurality of memory regions or plurality of processing regions; and one or more centralized or distributed control circuitry configured to control data flow into each given one of the plurality of processing regions from a first adjacent one of the plurality of memory regions to a second adjacent one of the plurality of memory regions.

Example 2 includes the memory processing unit of Example 1, wherein: the plurality of processing regions are columnal interleaved between the plurality of memory regions; and the one or more control circuitry is configured to control data flow between each given one of the plurality of processing regions from adjacent ones of the plurality of memory regions in a cross-columnal direction.

Example 3 includes the memory processing unit of Example 2, wherein each of the plurality of processing regions comprises a plurality of processing cores.

Example 4 includes the memory processing unit of Example 3, wherein the control circuitry is further configured to control data flow between the processing cores in respective ones of the plurality of processing regions in a columnal direction.

Example 5 includes the memory processing unit of Example 3, wherein a computation function is partitioned between a plurality of processing cores.

Example 6 includes the memory processing unit of Example 1, wherein the one or more computation functions comprise one or more computation functions of a neural network.

Example 7 includes the memory processing unit of Example 6, wherein the neural network comprises a plurality of layers, wherein each layer includes one or more computation functions.

Example 8 includes the memory processing unit of Example 1, wherein the control circuitry includes a software layer configured to receive a neural network model and generate a configuration stream to configure the plurality of memory regions and the plurality of processing units.

Example 9 includes the memory processing unit of Example 3, wherein each processing core comprises a processing element, one or more counters, one or more write-back registers, one or more controllers, one or more address translators, and one or more memory region interfaces.

Example 10 incudes the memory processing unit of Example 9, wherein each processing element comprises one or more memory arrays, one or more input registers, one or more accumulators and one or more output registers.

Example 11 includes the memory processing unit of Example 9, wherein the one or more memory arrays comprise one or more resistive random access memory (Re-RAM) arrays.

Example 12 includes the memory processing unit of Example 9, wherein the one or more memory arrays comprise one or more magnetic random access memory (MRAM) arrays.

Example 13 includes the memory processing unit of Example 9, wherein the one or more memory arrays comprise one or more phase change random access memory (PCRAM) arrays.

Example 14 includes memory processing unit of Example 9, wherein the plurality of memory regions comprise a plurality of static random access memory (SRAM).

Example 15 includes a memory processing unit comprising: a plurality of first memory regions configured to store data; a plurality of second memory regions columnal interleaved between the plurality of first memory regions, wherein one or more of the plurality of second memory regions are configured to perform one or more computation functions; a communication link coupled between the columnal interleaved plurality of first and second memory regions configured for moving data between non-adjacent ones of the plurality of first and second memory regions; and centralized or distributed control circuitry configured to control data flow into each given one of the plurality of first memory regions from a first adjacent one of the plurality of second memory regions to a second adjacent one of the plurality of second memory regions in a cross-columnal direction and to control data flow within each given one of the plurality of first memory regions in a columnal direction.

Example 16 includes the memory processing unit of Example 15, wherein the plurality of first memory regions comprise a plurality of static random access memory (SRAM) regions.

Example 17 includes the memory processing unit of Example 15, wherein the plurality of second memory regions comprise a plurality of resistive random access memory (ReRAM) regions.

Example 18 includes the memory processing unit of Example 15, wherein the data flow comprises a pipelined data flow.

Example 19 includes the memory processing unit of Example 15, wherein each of the plurality of second memory regions comprise a plurality of processing cores arranged in columnal series.

Example 20 includes the memory processing unit of Example 15, wherein a plurality of processing cores in one or more of the plurality of second memory regions are configured to perform respective computation functions at the same time.

Example 21 includes the memory processing unit of Example 20, wherein the plurality of processing cores in one or more of the plurality of second memory regions perform respective computation functions on a same frame of data.

Example 22 includes the memory processing unit of Example 15, wherein the data moving between non-adjacent ones of the plurality of first and second memory regions comprise edge outputs.

Example 23 includes the memory processing unit of Example 15, wherein data flowing within each given one of the plurality of first memory region in the columnal direction comprise partial sums.

Example 24 includes the memory processing unit of Example 15, wherein one or more neural network layers are mapped to respective ones of the plurality of second memory regions.

Example 25 includes the memory processing unit of Example 15, wherein a set of processing cores of a given one of the plurality of second memory regions can operate on a same neural network layer.

Example 26 includes the memory processing unit of Example 15, wherein a plurality of neural network layers are mapped to a respective ones of the plurality of second memory regions.

Example 27 includes that memory processing unit of Example 15, wherein a neural network layer is mapped to two or more of the plurality of second memory regions.

Example 28 include the memory processing unit of Example 15, wherein the control circuitry comprises a centralized control circuitry.

Example 29 includes the memory processing unit of Example 15, wherein the control circuitry is localized to one or more of the plurality of first memory regions, the plurality of second memory regions and the communication link.

Example 30 includes the memory processing unit of Example 15, wherein the control circuitry comprises a centralized portions and distributed portions localized to one or more of the plurality of first memory regions, the plurality of second memory regions and the communication link.

Example 31 includes a method comprising: receiving a model; configuring one or more of a plurality of processing regions of a memory processing unit to perform one or more computation functions of the model; and configuring one or more of a plurality of memory regions of the memory processing unit to control data flow into the one or more of the plurality of processing regions from a first adjacent one of the plurality of memory regions, wherein the plurality of processing regions are interleaved between the plurality of memory regions.

Example 32 includes the method according to Example 31, further comprising: receiving input data; and computing output data from the input data processed by the configured one or more of the plurality of processing regions and the configured one or more of the plurality of memory regions of the memory processing unit.

Example 33 includes the method according to Example 31, wherein the model comprises a machine learning algorithm, the machine learning algorithm comprises an artificial neural network.

Example 34 includes the method according to Example 33, wherein the artificial neural network comprises a convolution neural network (CNN) or a recurrent neural network (RNN).

Example 35 includes the method according to Example 31, wherein the plurality of processing regions are columnal interleaved between the plurality of memory regions.

Example 36 includes the method according to Example 35, wherein the plurality of memory regions comprise a plurality of static random access memory (SRAM) regions.

Example 37 includes the method according to Example 35, wherein the plurality of processing regions comprise one of a plurality of resistive random access memory (ReRAM) regions, a plurality of magnetic random access memory (MRAM) regions, or a plurality of phase change random access memory (PCRAM) regions.

Example 38 includes the method according to Example 31, wherein configuring the one or more of a plurality of processing regions comprises programming one or more of a plurality of processing cores of one or more of the plurality of processing regions to perform the one or more computation functions.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A memory processing unit comprising:
   a plurality of memory regions;
   a plurality of processing regions interleaved between the plurality of memory regions, wherein one or more of the plurality of processing regions are configured to perform one or more computation functions;
   one or more communication links coupled between the interleaved plurality of memory regions and plurality of processing units, wherein the communication links are configured for moving data between non-adjacent ones of the plurality of memory regions or plurality of processing regions; and
   one or more centralized or distributed control circuitry configured to control data flow into each given one of the plurality of processing regions from a first adjacent one of the plurality of memory regions to a second adjacent one of the plurality of memory regions.

2. The memory processing unit of claim 1, wherein:
   the plurality of processing regions are columnal interleaved between the plurality of memory regions; and
   the one or more control circuitry is configured to control data flow between each given one of the plurality of processing regions from adjacent ones of the plurality of memory regions in a cross-columnal direction.

3. The memory processing unit of claim 2, wherein each of the plurality of processing regions comprises a plurality of processing cores.

4. The memory processing unit of claim 3, wherein the control circuitry is further configured to control data flow between the processing core in respective ones of the plurality of processing regions in a columnal direction.

5. The memory processing unit of claim 3, wherein a computation function is partitioned between a plurality of processing cores.

6. The memory processing unit of claim 1, wherein the one or more computation functions comprise one or more computation functions of a neural network.

7. The memory processing unit of claim 6, wherein the neural network comprises a plurality of layers, wherein each layer includes one or more computation functions.

8. The memory processing unit of claim 1, wherein the control circuitry includes a software layer configured to receive a neural network model and generate a configuration stream to configure the plurality of memory regions and the plurality of processing units.

9. The memory processing unit of claim 3, wherein each processing core comprises a processing element, one or more counters, one or more write-back registers, one or more controllers, one or more address translators, and one or more memory region interfaces.

10. The memory processing unit of claim 9, wherein each processing element comprises one or more memory arrays, one or more input register, one or more accumulators and one or more output registers.

11. A memory processing unit comprising:
a plurality of first memory regions configured to store data;
a plurality of second memory regions columnal interleaved between the plurality of first memory regions, wherein one or more of the plurality of second memory regions are configured to perform one or more computation functions;
a communication link coupled between the columnal interleaved plurality of first and second memory regions configured for moving data between non-adjacent ones of the plurality of first and second memory regions; and
control circuitry configured to control data flow into each given one of the plurality of first memory regions from a first adjacent one of the plurality of second memory regions to a second adjacent one of the plurality of second memory regions in a cross-columnal direction and to control data flow within each given one of the plurality of first memory regions in a columnal direction.

12. The memory processing unit of claim 11, wherein each of the plurality of second memory regions comprise a plurality of processing cores arranged in columnal series.

13. The memory processing unit of claim 11, wherein a plurality of processing cores in one or more of the plurality of second memory regions are configured to perform respective computation functions at the same time.

14. The memory processing unit of claim 13, wherein the plurality of processing cores in one or more of the plurality of second memory regions perform respective computation functions on a same frame of data.

15. The memory processing unit of claim 11, wherein the data moving between non-adjacent ones of the plurality of first and second memory regions comprise edge outputs.

16. The memory processing unit of claim 11, wherein data flowing within each given one of the plurality of first memory region in the columnal direction comprise partial sums.

17. The memory processing unit of claim 11, wherein one or more neural network layers are mapped to respective ones of the plurality of second memory regions.

18. The memory processing unit of claim 11, wherein a set of processing cores of a given one of the plurality of second memory regions can operate on a same neural network layer.

19. The memory processing unit of claim 11, wherein a plurality of neural network layers are mapped to a respective ones of the plurality of second memory regions.

20. The memory processing unit of claim 11, wherein a neural network layer is mapped to two or more of the plurality of second memory regions.

21. A method comprising:
receiving a model by a memory processing unit including,
a plurality of memory regions, and
a plurality of processing regions interleaved between the plurality of memory regions, wherein the plurality of processing regions each include one or more memory arrays configurable to perform one or more computation functions;
configuring one or more of the plurality of processing regions to perform one or more computation functions of the model; and
configuring one or more of the plurality of memory regions to control data flow into the one or more of the plurality of processing regions from a first adjacent one of the plurality of memory regions.

22. The method according to claim 21, further comprising:
receiving input data; and
computing output data from the input data processed by the configured one or more of the plurality of processing regions and the configured one or more of the plurality of memory regions of the memory processing unit.

23. The method according to claim 21, wherein the model comprises a machine learning algorithm, the machine learning algorithm comprises an artificial neural network.

24. The method according to claim 21, wherein configuring the one or more of a plurality of processing regions comprises programming one or more of a plurality of processing cores of one or more of the plurality of processing regions to perform the one or more computation functions.

* * * * *